United States Patent
Kwon et al.

(10) Patent No.: US 10,340,148 B2
(45) Date of Patent: *Jul. 2, 2019

(54) POLYMER, ORGANIC LAYER COMPOSITION, AND METHOD OF FORMING PATTERNS

(71) Applicant: SAMSUNG SDI CO., LTD., Yongin-si, Gyeonggi-do (KR)

(72) Inventors: Hyo Young Kwon, Suwon-si (KR); Ran Namgung, Suwon-si (KR); Dominea Rathwell, Suwon-si (KR); Hyeonil Jung, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 136 days.

This patent is subject to a terminal disclaimer.

(21) Appl. No.: 15/264,664

(22) Filed: Sep. 14, 2016

(65) Prior Publication Data

US 2017/0110328 A1    Apr. 20, 2017

(30) Foreign Application Priority Data

Oct. 19, 2015 (KR) .................. 10-2015-0145367

(51) Int. Cl.
*H01L 21/308* (2006.01)
*C08G 73/06* (2006.01)
(Continued)

(52) U.S. Cl.
CPC .......... *H01L 21/3081* (2013.01); *C08G 14/02* (2013.01); *C08G 14/04* (2013.01); *C08G 14/06* (2013.01); *C08G 73/0672* (2013.01); *C08G 73/18* (2013.01); *C08G 73/22* (2013.01); *C08G 75/32* (2013.01); *C09D 161/34* (2013.01); *C09D 179/04* (2013.01);
*G03F 7/0392* (2013.01); *G03F 7/11* (2013.01); *G03F 7/168* (2013.01); *G03F 7/20* (2013.01); *G03F 7/30* (2013.01); *H01L 21/0274* (2013.01); *H01L 21/0276* (2013.01); *H01L 21/02532* (2013.01);
(Continued)

(58) Field of Classification Search
CPC .................................................. H01L 21/3081
USPC ........................................................ 528/247
See application file for complete search history.

(56) References Cited

U.S. PATENT DOCUMENTS 9,971,243 B2 * 5/2018 Park et al. .............. G03F 7/091
2006/0019195 A1 1/2006 Hatakeyama et al.

FOREIGN PATENT DOCUMENTS

CN    102024905 A    4/2011
CN    104067175 A    9/2014
(Continued)

OTHER PUBLICATIONS

Taiwanese Office Action dated May 12, 2017, of the corresponding Taiwanese Patent Application No. 105130943.
(Continued)

*Primary Examiner* — Duc Truong
(74) *Attorney, Agent, or Firm* — Lee & Morse, P.C.

(57) ABSTRACT

A polymer, an organic layer composition, and a method of forming patterns, the polymer including a structural unit represented by Chemical Formula 1:

[Chemical Formula 1]

$$*\!-\!\!\left[\!A\!-\!B\right]\!\!-\!\!*.$$

18 Claims, 1 Drawing Sheet

[Calculation Equation 1]

$$\Delta mass = \frac{-\Delta freq * A * sqrt(\mu q * \rho q)}{2(Fq^2)}$$

* Δmass = Mass change
* Δfreq = Resonant frequency change
* A = Area of active surface(0.196cm²)
* μq = AT-cut quartz constant(2.947×10¹¹cm⁻¹s²)
* ρq = Quartz crystal density(2.65g/cm³)
* Fq = Reference frequency (9.00MHz)

(51) Int. Cl.
    *C08G 73/22* (2006.01)
    *C08G 75/32* (2006.01)
    *G03F 7/039* (2006.01)
    *G03F 7/11* (2006.01)
    *G03F 7/16* (2006.01)
    *G03F 7/20* (2006.01)
    *G03F 7/30* (2006.01)
    *H01L 21/02* (2006.01)
    *H01L 21/027* (2006.01)
    *H01L 21/306* (2006.01)
    *H01L 21/324* (2006.01)
    *C08G 14/02* (2006.01)
    *C08G 14/04* (2006.01)
    *C08G 14/06* (2006.01)
    *C09D 161/34* (2006.01)
    *C09D 179/04* (2006.01)
    *C08G 73/18* (2006.01)
    *H01L 21/033* (2006.01)
    *C08G 65/00* (2006.01)
    *C09D 153/00* (2006.01)
    *C09D 165/00* (2006.01)
    *G03F 7/00* (2006.01)

(52) U.S. Cl.
    CPC .... *H01L 21/02623* (2013.01); *H01L 21/0332* (2013.01); *H01L 21/3085* (2013.01); *H01L 21/30604* (2013.01); *H01L 21/324* (2013.01); *G03F 7/0035* (2013.01)

(56) References Cited

FOREIGN PATENT DOCUMENTS

| | | |
|---|---|---|
| CN | 104185816 A | 12/2014 |
| CN | 104250228 A | 12/2014 |
| CN | 104253024 A | 12/2014 |
| CN | 104718497 A | 6/2015 |
| CN | 104926748 A | 9/2015 |
| JP | 2007-199653 A | 8/2007 |
| JP | 5000191 B2 | 8/2012 |
| JP | 2014-029435 A | 2/2014 |
| JP | 5641253 B2 | 12/2014 |
| KR | 10-2013-0046498 A | 5/2013 |
| KR | 10-2013-0130005 A | 11/2013 |
| KR | 10-2014-0122225 A | 10/2014 |
| KR | 10-2014-0144207 A | 12/2014 |
| TW | 200936635 A | 9/2009 |
| WO | WO 2010/147155 A1 | 12/2010 |
| WO | WO 2012/077640 A1 | 6/2012 |
| WO | WO 2012/096071 A1 | 7/2012 |
| WO | WO 2013/005797 A1 | 1/2013 |
| WO | WO 2013/115097 A1 | 8/2013 |
| WO | WO 2013/146670 A1 | 10/2013 |

OTHER PUBLICATIONS

Office Action dated Jan. 2, 2019, along with the Search Report dated Dec. 24, 2018, of the corresponding Chinese Patent Application No. 201610899626.X.

Provisional double patenting rejection over clais of the above-identified application; USPTO Office Action dated May 1, 2019, in U.S. Appl. No. 15/268,706.

\* cited by examiner

[FIG. 1]
[Calculation Equation 1]
$$\Delta mass = \frac{-\Delta freq * A * sqrt(\mu q * \rho q)}{2(Fq^2)}$$
- $\Delta mass$ = Mass change
- $\Delta freq$ = Resonant frequency change
- A = Area of active surface (0.198cm²)
- µq = AT-cut quartz constant (2.947x10¹¹ cm · s²)
- ρq = Quartz crystal density (2.65g/cm³)
- Fq = Reference frequency (9.00MHz)
[FIG. 2]
[Calculation Equation 3]
$$Planarization = \left(1 - \frac{h_2}{h_1}\right) \times 100$$

POLYMER, ORGANIC LAYER COMPOSITION, AND METHOD OF FORMING PATTERNS

CROSS-REFERENCE TO RELATED APPLICATION

Korean Patent Application No. 10-2015-0145367, filed on Oct. 19, 2015, in the Korean Intellectual Property Office, and entitled: "Polymer, Organic Layer Composition, and Method of Forming Patterns," is incorporated by reference herein in its entirety.

BACKGROUND

1. Field

Embodiments relate to a polymer, an organic layer composition including the polymer, and a method of forming patterns using the organic layer composition.

2. Description of the Related Art

Recently, a high integration design in accordance with down-sizing (miniaturization) and complexity of an electronic device has accelerated development of a more advanced material and its related process, and accordingly, lithography using a photoresist may use new patterning materials and techniques.

In a patterning process, an organic layer called as a hardmask layer may be formed as a hard interlayer to transfer the fine pattern of the photoresist down to a sufficient depth on a substrate without its collapse.

SUMMARY

Embodiments are directed to a polymer, an organic layer composition including the polymer, and a method of forming patterns using the organic layer composition.

The embodiments may be realized by providing a polymer including a structural unit represented by Chemical Formula 1:

[Chemical Formula 1]

wherein, in Chemical Formula 1, B is a divalent organic group, * is a linking point, and A is a substituted or unsubstituted divalent group from one of the following compounds,

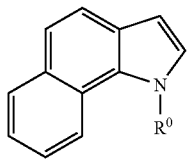
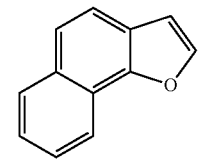
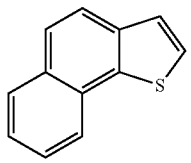
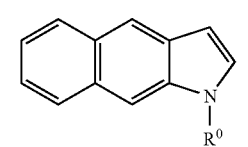
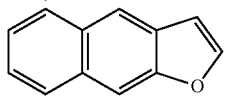
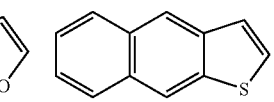

-continued

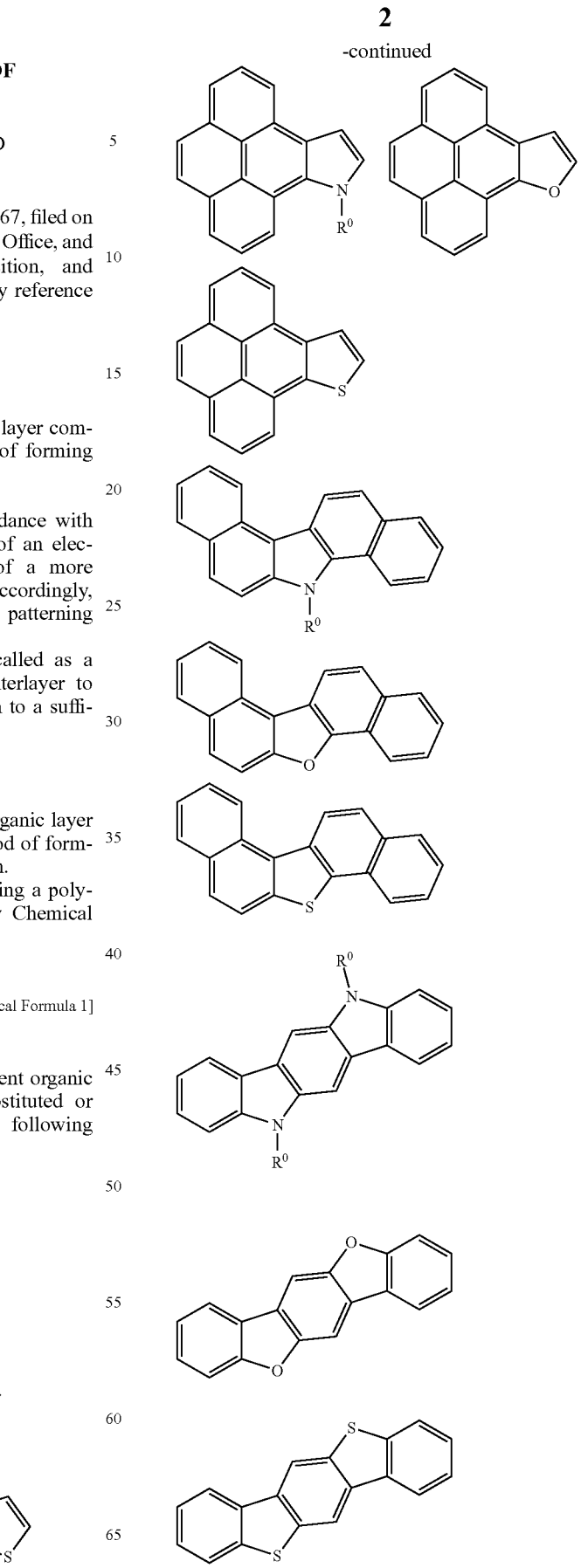

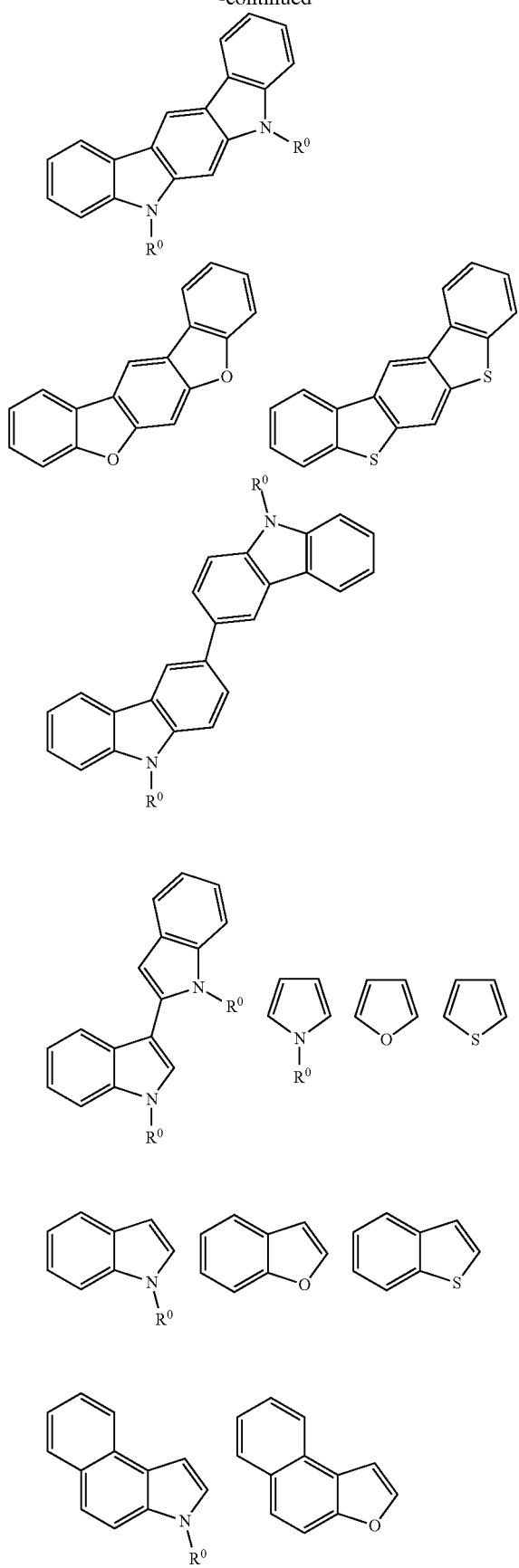
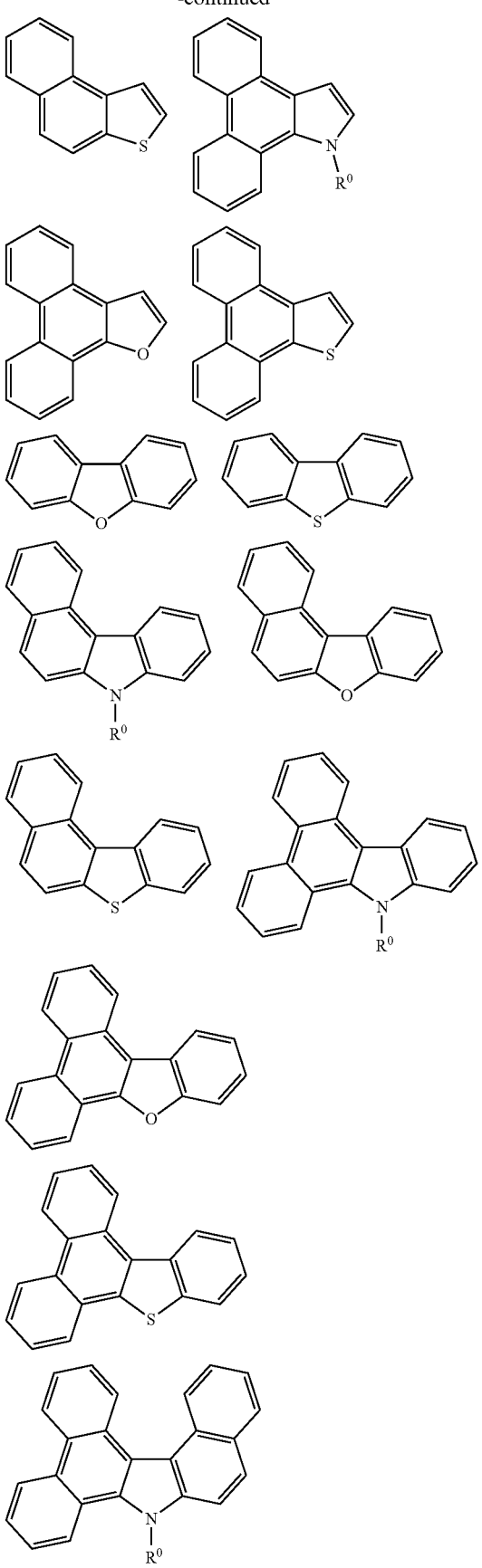

-continued

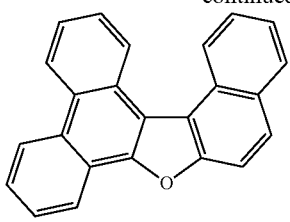

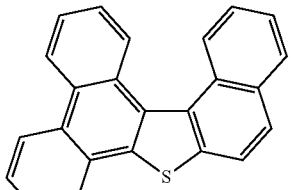

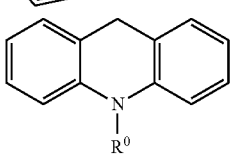

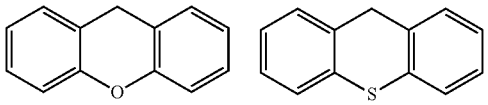

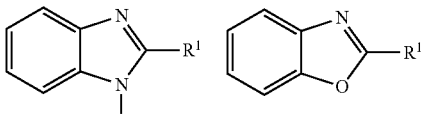

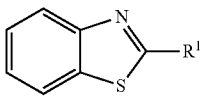

wherein, in the above compounds, $R^0$ and $R^1$ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

$R^1$ may be a substituted or unsubstituted phenyl group.

In Chemical Formula 1, B may be a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

The structural unit represented by Chemical Formula 1 may be represented by one of Chemical Formula 1-1 or Chemical Formula 1-2:

[Chemical Formula 1-1]

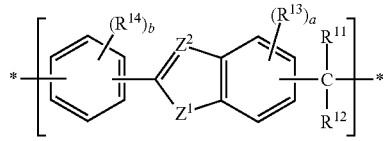

[Chemical Formula 1-2]

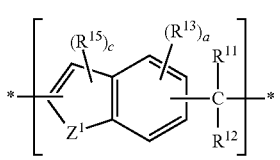

wherein, in Chemical Formulae 1-1 and 1-2, $Z^1$ may be $NR^{10}$, oxygen (O), or sulfur (S), $Z^2$ may be nitrogen (N), $R^{10}$, $R^{11}$, and $R^{12}$ may each independently be hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, $R^{13}$ to $R^{15}$ may each independently be a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, a and b may each independently be an integer of 0 to 3, c may be 0 or 1, and * is a linking point.

The polymer may further include a structural unit represented by Chemical Formula 2:

[Chemical Formula 2]

$$*{\dashv}C{-}D{\dashv}*$$

wherein, in Chemical Formula 2, C may be a group including a substituted or unsubstituted aromatic ring, D may be a divalent organic group, and * is a linking point.

In Chemical Formula 2, C may be a substituted or unsubstituted divalent group from one of the following compounds,

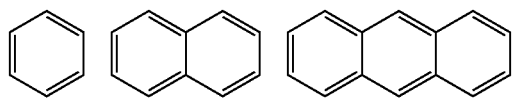

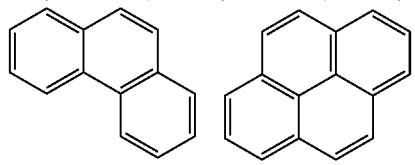

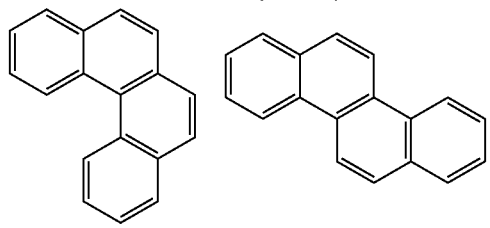

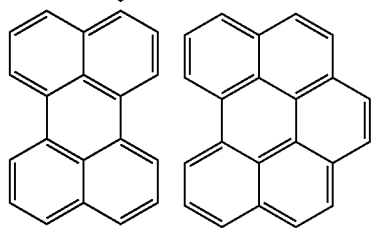

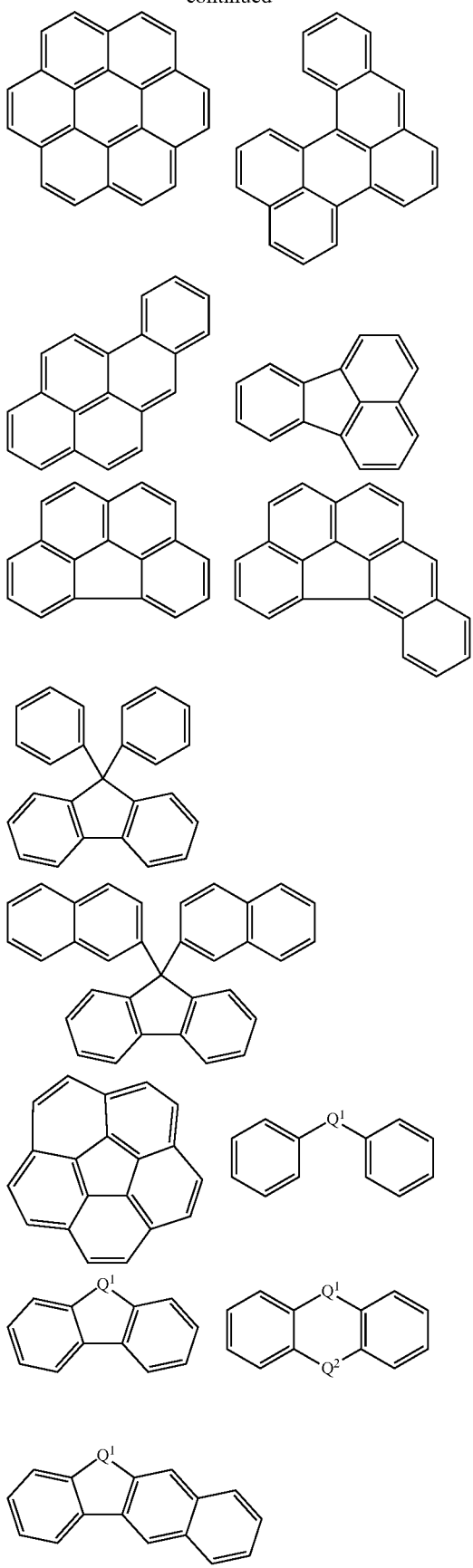
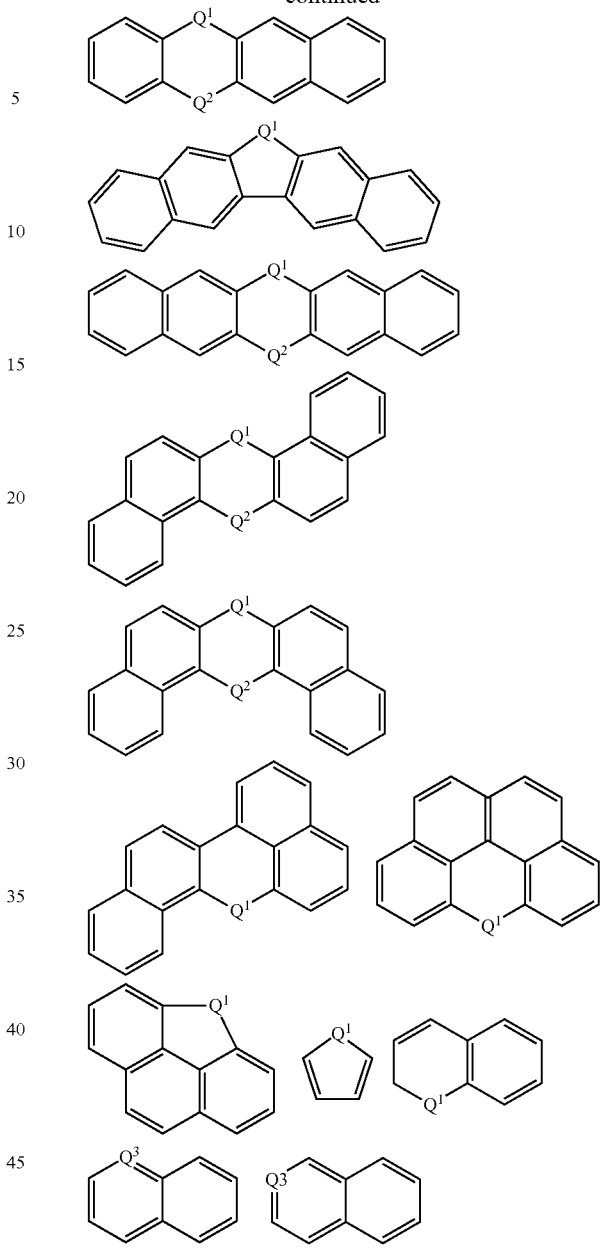

wherein, in the above compounds, $Q^1$ and $Q^2$ may each independently be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, $Q^3$ may be nitrogen (N), $CR^b$, or a combination thereof, and $R^a$ and $R^b$ may each independently be hydrogen, a substituted or unsubstituted C1 to C10 alkyl group, a halogen atom, a halogen-containing group, or a combination thereof.

In Chemical Formula 2, D may be a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

The structural unit represented by Chemical Formula 2 may be represented by one of Chemical Formulae 2-1 to 2-3:

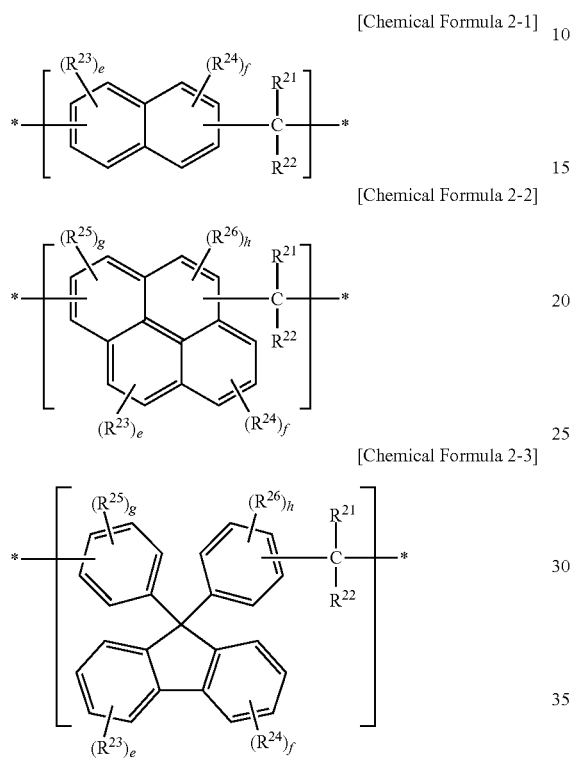

[Chemical Formula 2-1]

[Chemical Formula 2-2]

[Chemical Formula 2-3]

wherein, in Chemical Formulae 2-1 to 2-3, $R^{21}$ and $R^{22}$ may each independently be hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, $R^{23}$ to $R^{26}$ may each independently be a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, e to h may each independently be an integer ranging from 0 to 2, and * is a linking point.

The polymer may have a weight average molecular weight of about 500 to about 200,000.

The embodiments may be realized by providing an organic layer composition including a polymer including a structural unit represented by Chemical Formula 1, and a solvent:

[Chemical Formula 1]

wherein, in Chemical Formula 1, B is a divalent organic group, * is a linking point, and A is a substituted or unsubstituted divalent group from one of the following compounds,

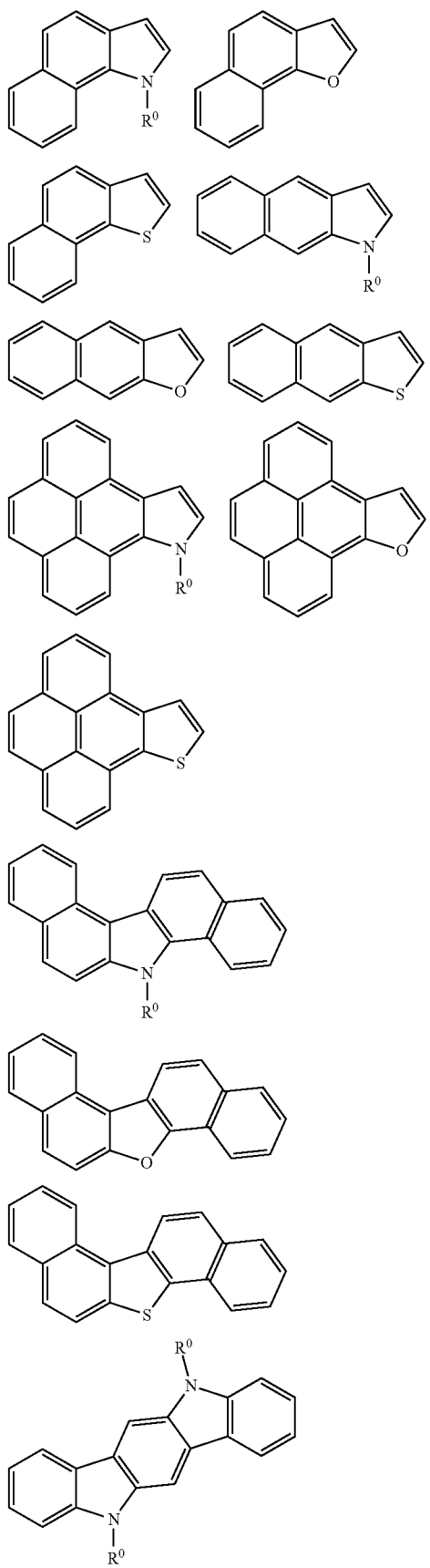

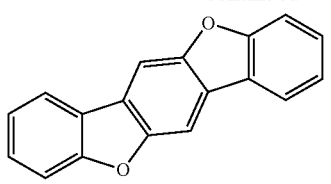
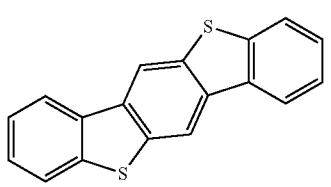
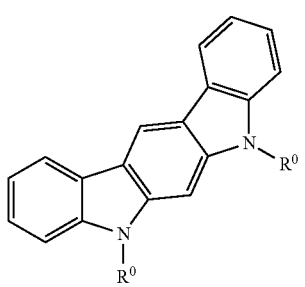
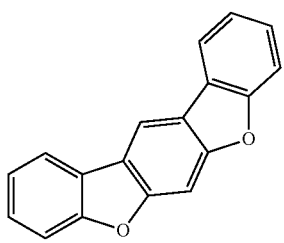
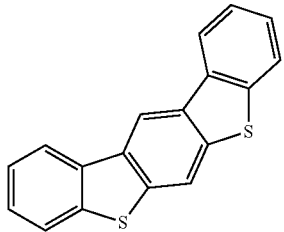
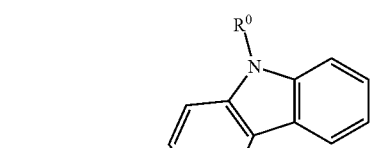
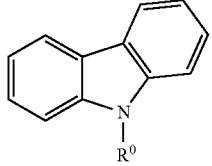
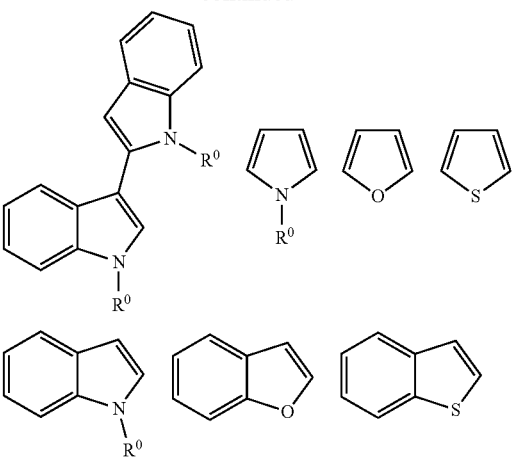
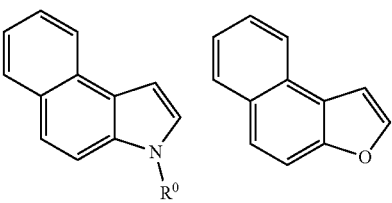
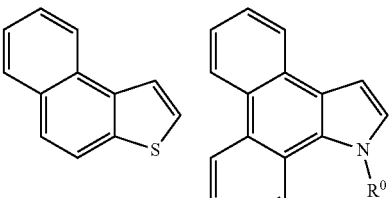
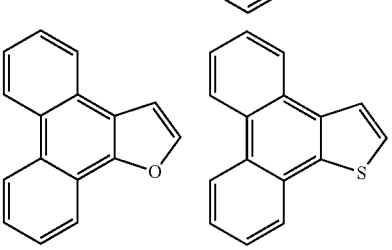
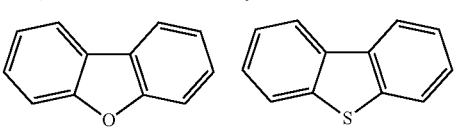
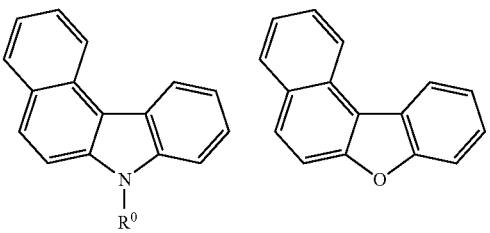
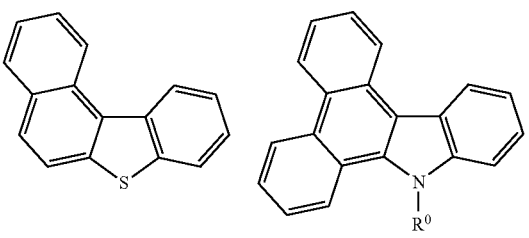

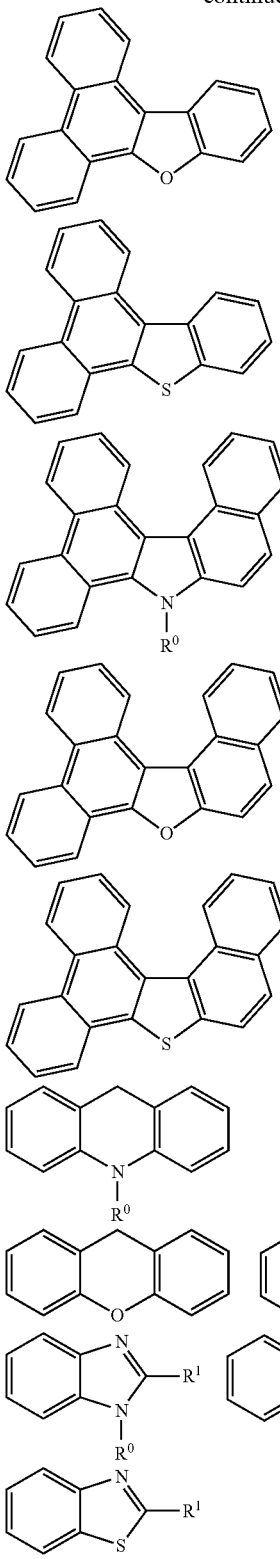

wherein, in the above compounds, $R^0$ and $R^1$ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

$R^1$ may be a substituted or unsubstituted phenyl group.

In Chemical Formula 1, B may be a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

The structural unit represented by Chemical Formula 1 may be represented by one of Chemical Formula 1-1 or Chemical Formula 1-2:

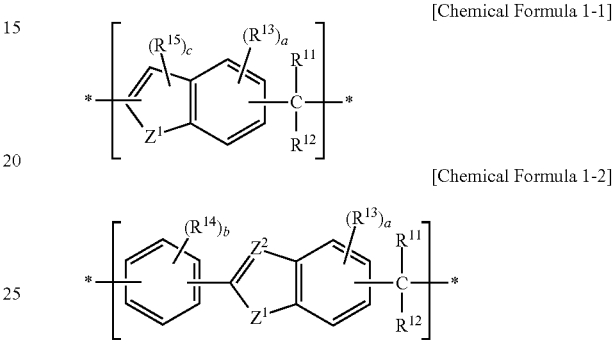

[Chemical Formula 1-1]

[Chemical Formula 1-2]

wherein, in Chemical Formulae 1-1 and 1-2, $Z^1$ may be $NR^{10}$, oxygen (O), or sulfur (S), $Z^2$ may be nitrogen (N), $R^{10}$, $R^{11}$, and $R^{12}$ may each independently be hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, $R^{13}$ to $R^{15}$ may each independently be a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, a and b may each independently be an integer of 0 to 3, c may be 0 or 1, and * is a linking point.

The polymer may further include a structural unit represented by Chemical Formula 2:

[Chemical Formula 2]

wherein, in Chemical Formula 2, C may be a group including a substituted or unsubstituted aromatic ring, D may be a divalent organic group, and * is a linking point.

In Chemical Formula 2, C may be a substituted or unsubstituted divalent group from one of the following compounds,

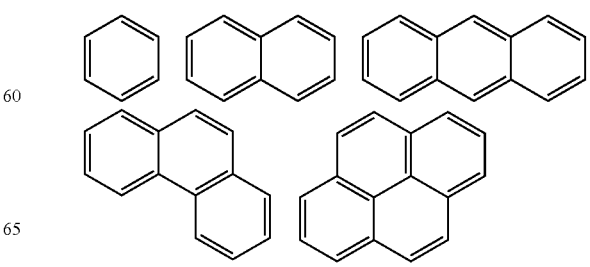

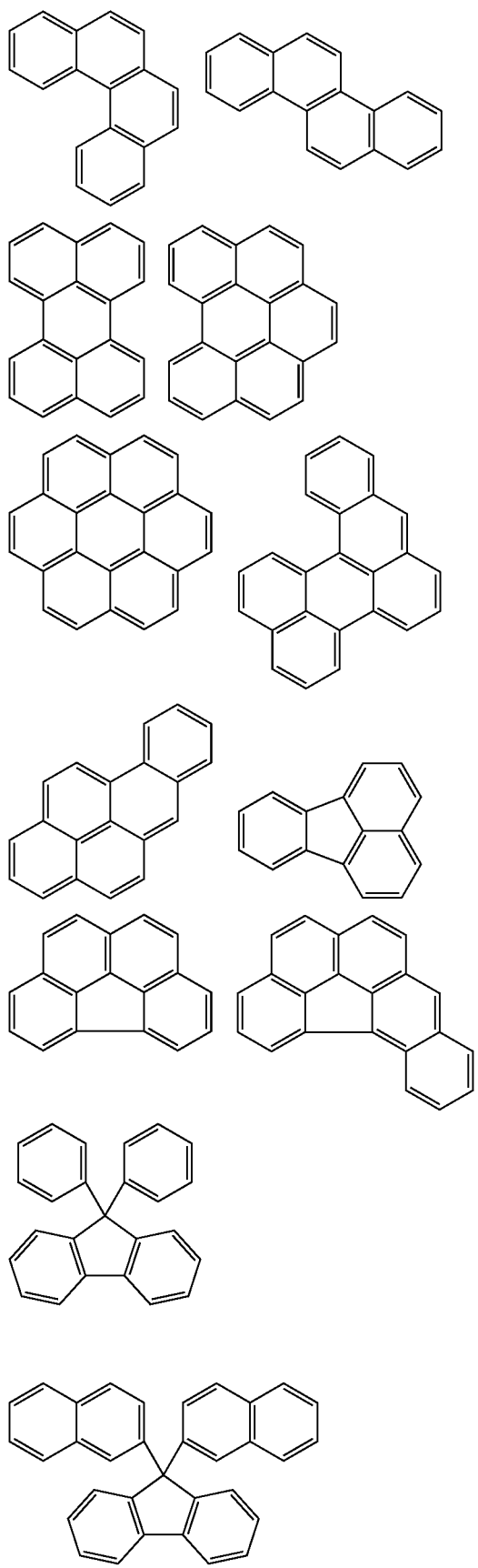
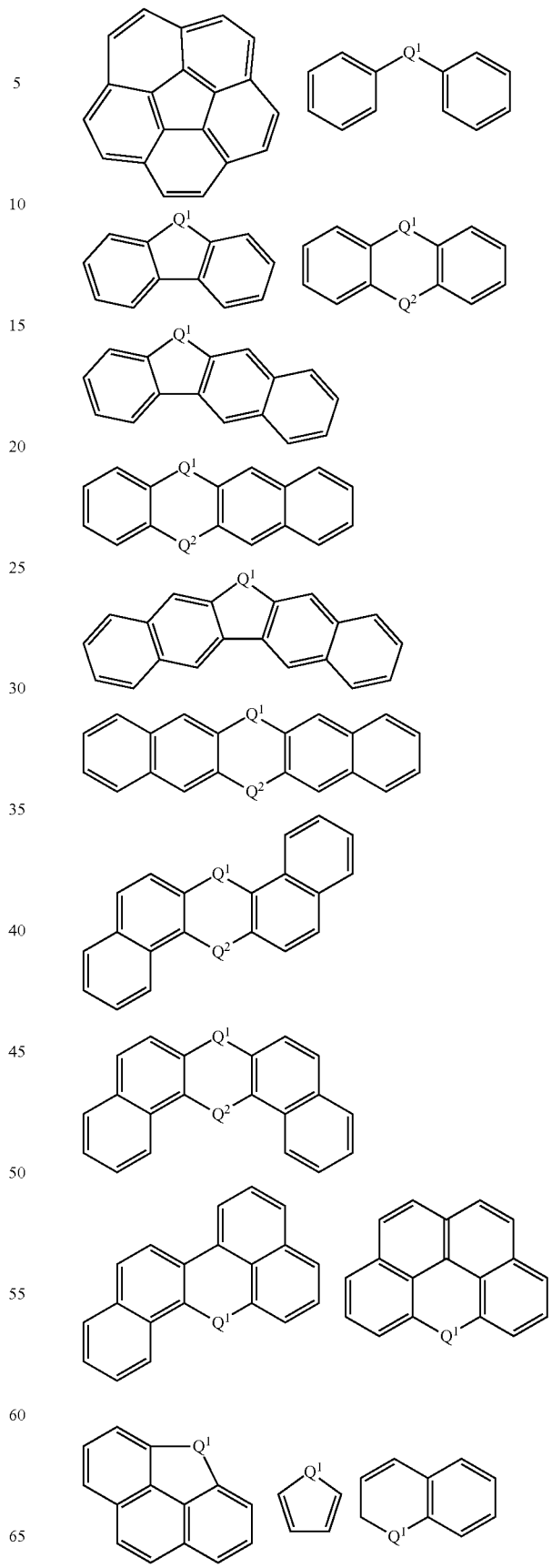

-continued

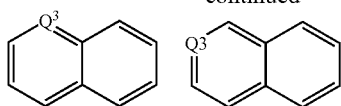

wherein, in the above compounds, $Q^1$ and $Q^2$ may each independently be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof, $Q^3$ may be nitrogen (N), $CR^b$, or a combination thereof, and $R^a$ and $R^b$ may each independently be hydrogen, a substituted or unsubstituted C1 to C10 alkyl group, a halogen atom, a halogen-containing group, or a combination thereof.

In Chemical Formula 2, D may be a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

The structural unit represented by Chemical Formula 2 may be represented by one of Chemical Formulae 2-1 to 2-3:

[Chemical Formula 2-1]

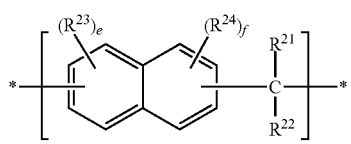

[Chemical Formula 2-2]

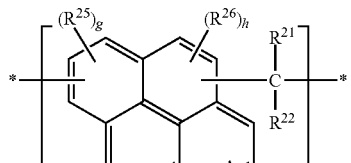

[Chemical Formula 2-3]

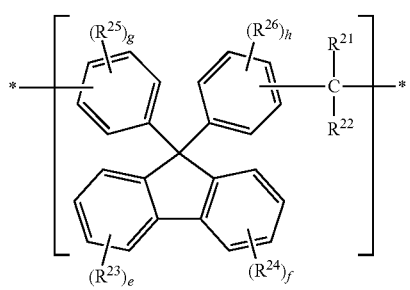

wherein, in Chemical Formulae 2-1 to 2-3, $R^{21}$ and $R^{22}$ may each independently be hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, $R^{23}$ to $R^{26}$ may each independently be a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, e to h may each independently be an integer ranging from 0 to 2, and * is a linking point.

The polymer may have a weight average molecular weight of about 500 to about 200,000.

The embodiments may be realized by providing a method of forming patterns, the method including providing a material layer on a substrate, applying the organic layer composition according to an embodiment on the material layer, heat-treating the organic layer composition to provide a hardmask layer, providing a silicon-containing thin layer on the hardmask layer, providing a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

Applying the organic layer composition may include performing a spin-on coating method.

The embodiments may be realized by providing an electronic device including the polymer according to an embodiment.

The embodiments may be realized by providing an electronic device including a pattern formed by the method according to an embodiment.

BRIEF DESCRIPTION OF THE DRAWINGS

Features will be apparent to those of skill in the art by describing in detail exemplary embodiments with reference to the attached drawings in which:

FIG. 1 illustrates a reference drawing for explaining Calculation Equation 1 to calculate out-gas amounts, and FIG. 2 illustrates a reference drawing for explaining Calculation Equation 3 to evaluate planarization characteristics.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present.

As used herein, when a definition is not otherwise provided, the term 'substituted' may refer to one substituted with or including a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of hydrogen of a compound.

As used herein, when a definition is not otherwise provided, the term 'hetero' may refer to one including 1 to 3 heteroatoms selected from N, O, S, and P.

Hereinafter, a polymer according to one embodiment is described.

A polymer according to one embodiment may include a structural unit represented by Chemical Formula 1.

[Chemical Formula 1]

*─(A─B)─*

In Chemical Formula 1, B may be a divalent organic group, and * is a linking point. A may be a hydrocarbon cyclic group including at least one hetero atom. In an implementation, A may be a substituted or unsubstituted divalent group of one of the compounds below, e.g., one of the compounds identified in the following Group 1.

[Group 1]

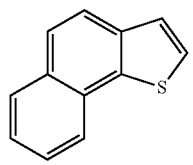
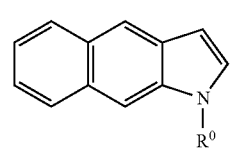
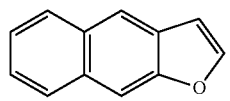
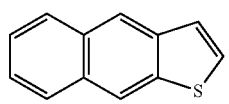
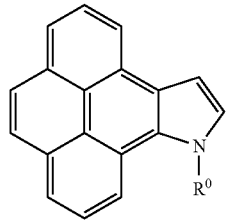
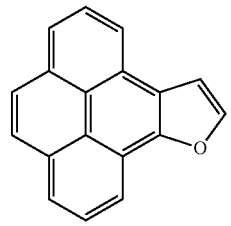
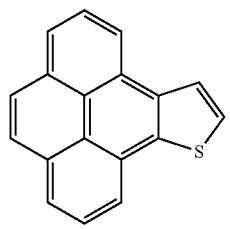

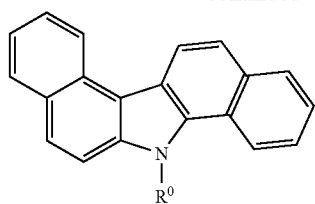
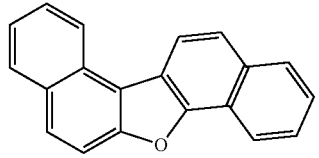
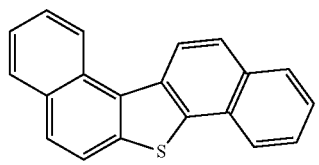
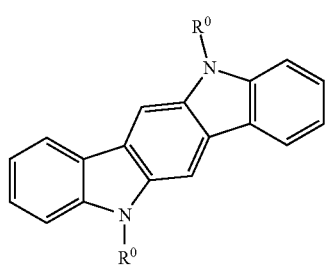
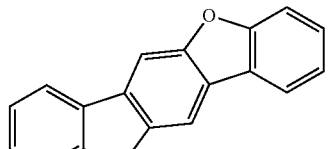
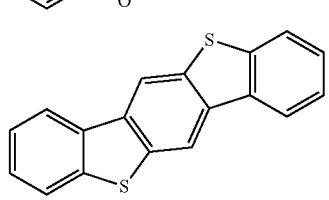
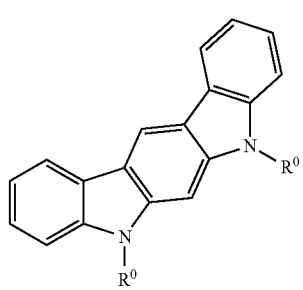
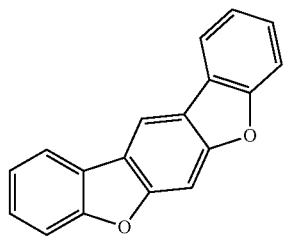

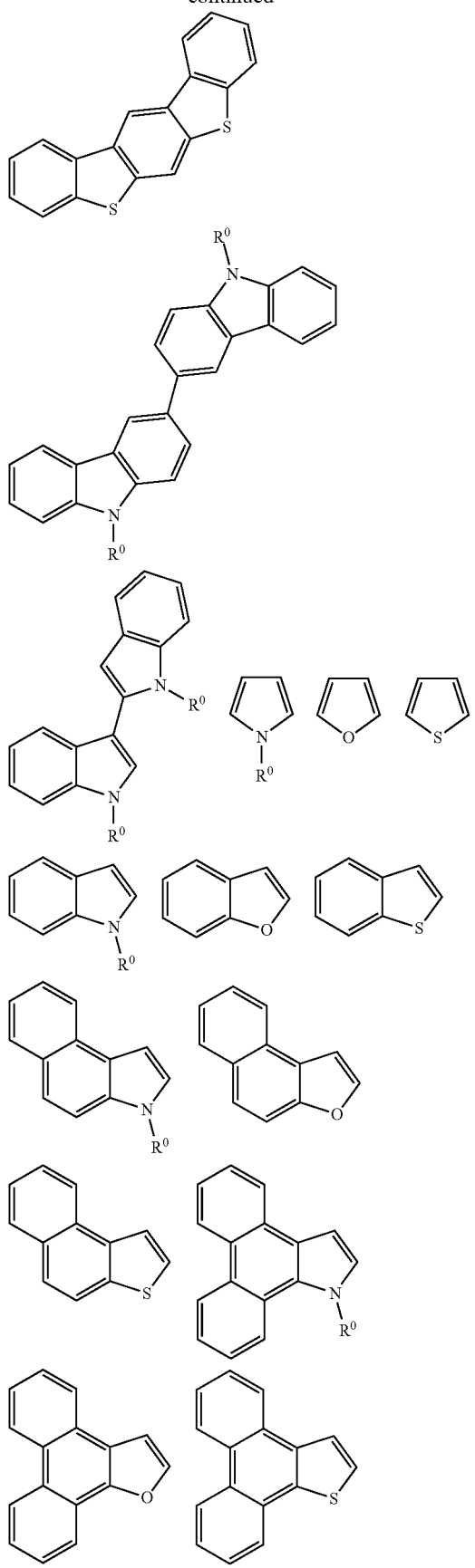
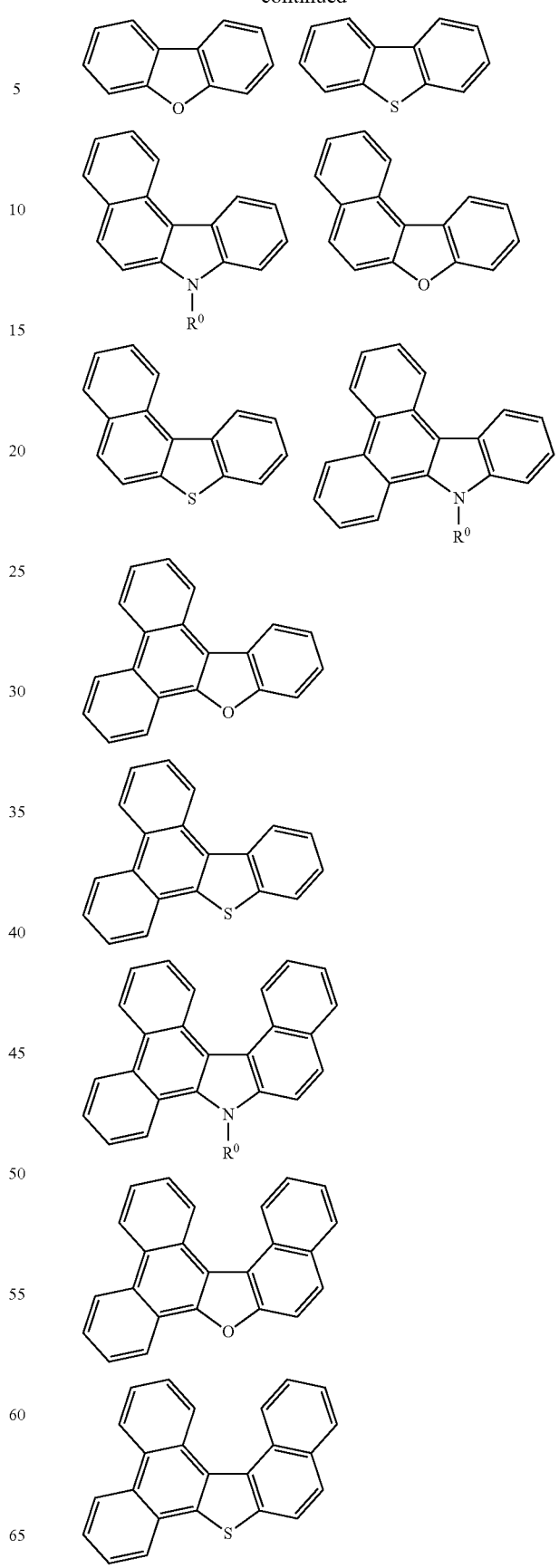

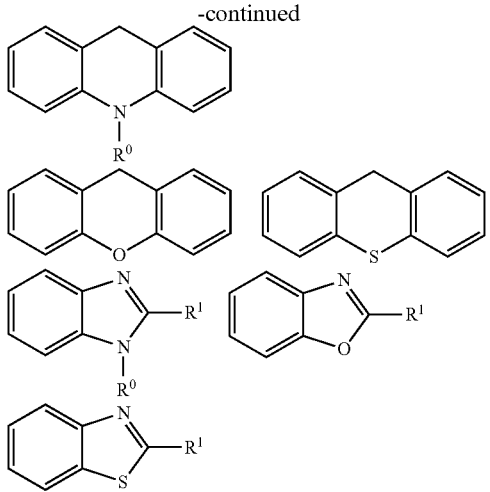

In the above compounds, $R^0$ and $R^1$ may each independently be or include, e.g., hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

The group A, e.g., a cyclic group of a compound of Group 1, in a structural unit represented by Chemical Formula 1 may be linked or bonded at a suitable location thereof. In an implementation, the group A may be substituted, e.g., hydrogen in the cyclic group of a compound of Group 1 may be replaced by a substituent.

The polymer may include a hydrocarbon cyclic group including a hetero atom in the structural unit represented by Chemical Formula 1.

The polymer may include a hetero atom such as nitrogen, oxygen, or sulfur in the structural unit and thus may not only secure etch resistance but also improve solubility due to polarity being increased by the hetero atom. In an implementation, the polymer may include a hydrocarbon cyclic group in the structural unit, and thus an organic layer formed by using the polymer may help secure excellent film density.

In an implementation, in Chemical Formula 1, when A is a divalent group of

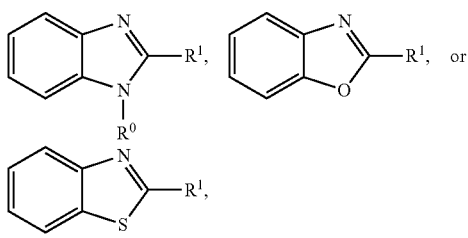

$R^1$ may be or may include a substituted or unsubstituted aromatic ring group, e.g., a substituted or unsubstituted phenyl group.

In Chemical Formula 1, the divalent organic group represented by B may be a linking group and may include, e.g., a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

In an implementation, in Chemical Formula 1, B may be or may include, e.g., a unsubstituted C1 to C20 alkylene group, or a C1 to C20 alkylene group wherein at least one hydrogen is replaced by a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

In an implementation, the structural unit represented by Chemical Formula 1 may be represented by Chemical Formula 1-1 or Chemical Formula 1-2.

[Chemical Formula 1-1]

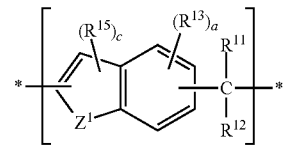

[Chemical Formula 1-2]

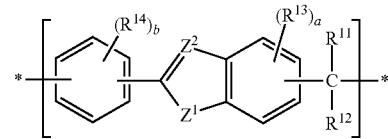

In Chemical Formulae 1-1 and 1-2, $Z^1$ may be $NR^{10}$, oxygen (O), or sulfur (S). $Z^2$ may be nitrogen (N).

$R^{10}$, $R^{11}$, and $R^{12}$ may each independently be or include, e.g., hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

$R^{13}$ to $R^{15}$ may each independently be or include, e.g., a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

a and b may each independently be, e.g., an integer of 0 to 3.

c may be 0 or 1.

* is a linking point.

In an implementation, the polymer may further include a structural unit represented by Chemical Formula 2.

[Chemical Formula 2]

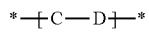

In Chemical Formula 2, C may be, e.g., a divalent group including a substituted or unsubstituted aromatic ring.

D may be, e.g., a divalent organic group.

* is a linking point.

In an implementation, in Chemical Formula 2, C may be a substituted or unsubstituted divalent cyclic group one of one of the following compounds, e.g., of compounds of the following Group 2.

[Group 2]

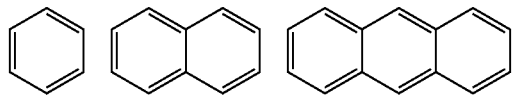

-continued
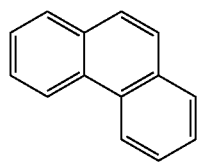 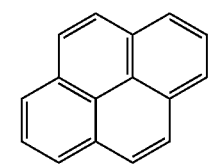
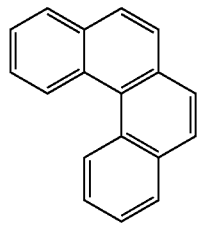 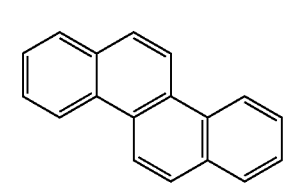
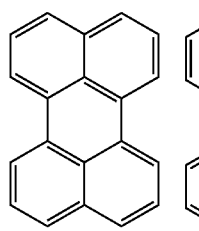 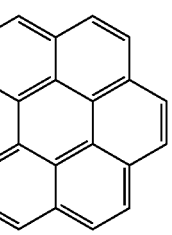
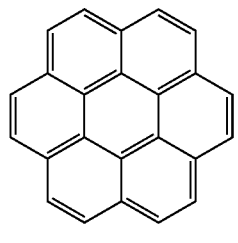 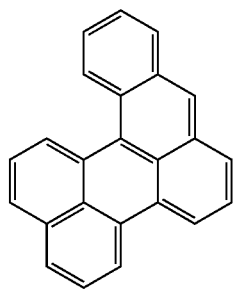
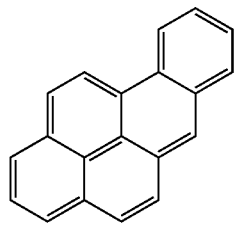 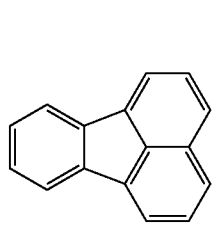
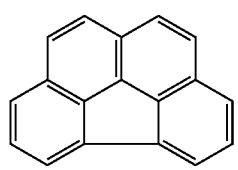 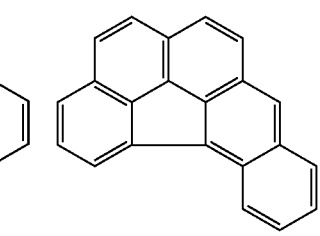
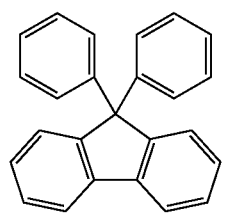
-continued
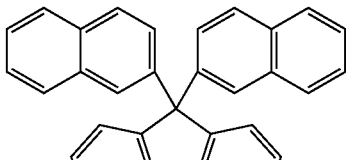
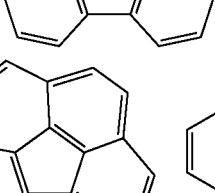
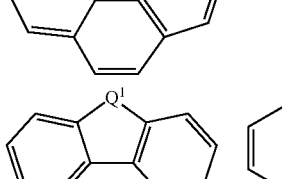
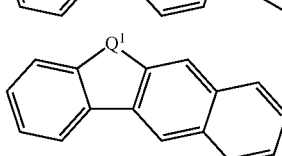
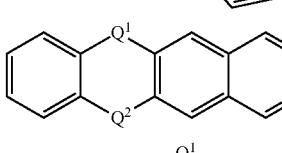
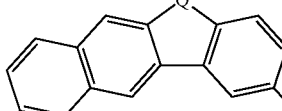
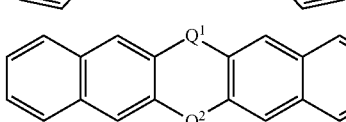
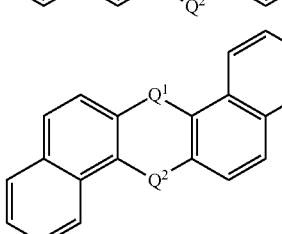
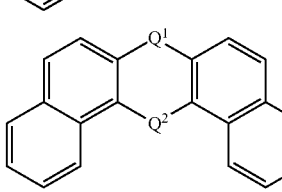
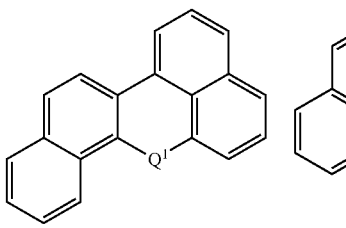

-continued

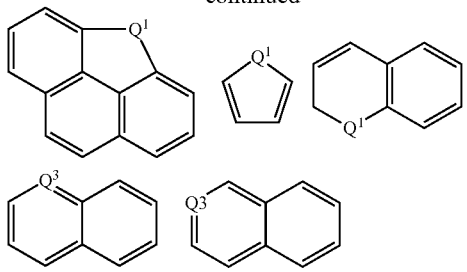

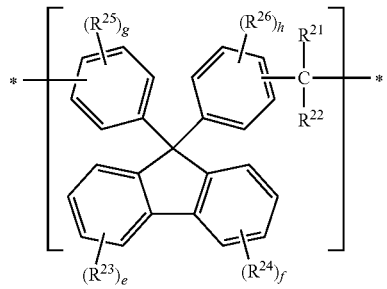

[Chemical Formula 2-3]

In the compounds in the above Group 2, $Q^1$ and $Q^2$ may each independently be or include, e.g., a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof.

$Q^3$ may be, e.g., nitrogen (N), $CR^b$, or a combination thereof.

$R^a$ and $R^b$ may each independently be or include, e.g., hydrogen, a substituted or unsubstituted C1 to C10 alkyl group, a halogen atom, a halogen-containing group, or a combination thereof.

In an implementation, in Chemical Formula 2, D may be a linking group, e.g., may be or may include a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

In an implementation, in Chemical Formula 2, D may be or may include, e.g., a unsubstituted C1 to C20 alkylene group or a C1 to C20 alkylene group wherein at least one hydrogen is replaced by a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

In an implementation, the structural unit represented by Chemical Formula 2 may be represented by, e.g., one of Chemical Formulae 2-1 to 2-3.

[Chemical Formula 2-1]

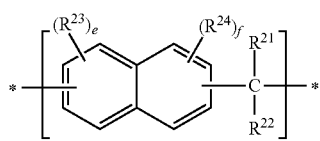

[Chemical Formula 2-2]

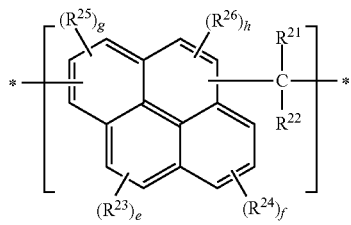

In Chemical Formulae 2-1 to 2-3, $R^{21}$ and $R^{22}$ may each independently be or include, e.g., hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group.

$R^{23}$ to $R^{26}$ may each independently be or include, e.g., a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

e to h may each independently be, e.g., an integer of 0 to 2.

* is a linking point.

In an implementation, the polymer may further include the structural unit represented by Chemical Formula 2, and thus the polymer may have improved etch resistance.

In an implementation, the polymer may be prepared through a condensation polymerization by using a hetero aromatic ring structure as a nucleophile and a multi-aromatic ring structure monomer as an electrophile. For example, the heteroatom (such as nitrogen, oxygen, or sulfur) included in the structural unit represented by Chemical Formula 1 may play a role of a flame retardant after forming the polymer and thus may help improve etch resistance of the polymer, as well as play a role of a reducing agent during the condensation polymerization.

In an implementation, the polymer may have a weight average molecular weight of about 500 to about 200,000. When the polymer has a weight average molecular weight within the range, an organic layer composition (e.g., a hardmask composition) including the polymer may be optimized by adjusting the amount of carbon and solubility in a solvent.

When the polymer is used as an organic layer material, excellent gap-fill and planarization characteristics may not only be provided when a step is present in a lower substrate (or a film) or when a pattern is formed, but a uniform thin film may also be formed without forming a pin-hole and a void during the baking or deteriorating a thickness distribution.

According to another embodiment, an organic layer composition including the polymer and a solvent may be provided.

The solvent may be a suitable solvent having sufficient dissolubility or dispersion for the polymer. In an implementation, the solvent may include, e.g., propylene glycol, propylene glycol diacetate, methoxy propanediol, diethylene glycol, diethylene glycol butylether, tri(ethyleneglycol)monomethylether, propylene glycol monomethylether, propylene glycol monomethylether acetate, cyclohexanone, ethyl-lactate, gamma-butyrolactone, methylpyrrolidone, acetylacetone, or ethyl 3-ethoxypropionate.

The polymer may be included in an amount of, e.g., about 1 to 50 wt %, based on a total weight of the organic layer composition. When the polymer is included in the range, a thickness, surface roughness, and planarization of the organic layer may be controlled.

In an implementation, the organic layer composition may further include an additive, e.g., a surfactant, a cross-linking agent, a thermal acid generator, a plasticizer, or the like.

The surfactant may include, e.g., alkylbenzene sulfonate salt, alkyl pyridinium salt, polyethylene glycol, or a quaternary ammonium salt.

The cross-linking agent may include, e.g., a melamine-based agent, a substituted urea-based agent, or a polymer-based agent. In an implementation, a cross-linking agent having at least two cross-linking forming substituent may include, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea, or the like.

The cross-linking agent may be a cross-linking agent having high heat resistance. The cross-linking agent having high heat resistance may be a compound including a cross-linking substituent including an aromatic ring (e.g., a benzene ring or a naphthalene ring) in the molecule.

The thermal acid generator may include, e.g., an acidic compound such as p-toluenesulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, or the like.

The additive may be present in an amount of about 0.001 to 40 parts by weight, based on 100 parts by weight of the organic layer composition. When the additive is included within the ranges, solubility may be improved without changing optical properties of the organic layer composition.

According to another embodiment, an organic layer manufactured using the organic layer composition may be provided. The organic layer may be, e.g., formed by coating the organic layer composition on a substrate and heat-treating it for curing and may include, for example, a hardmask layer, a planarization layer, a sacrificial layer, a filler, or the like for an electronic device.

Hereafter, a method for forming patterns by using the organic layer composition is described.

A method of forming patterns according to one embodiment may include, e.g., providing a material layer on a substrate, applying the organic layer composition (including the polymer and the solvent), heat-treating the organic layer composition (including the polymer and the solvent) to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition may be the same as described above, and may be applied by spin-on coating in a form of a solution. In an implementation, a thickness of the organic layer composition may be, e.g., about 50 Å to about 100,000 Å.

The heat-treating of the organic layer composition may be performed, e.g., at about 100 to about 500° C. for about 10 seconds to about 1 hour.

The silicon-containing thin layer may be formed of, e.g., SiCN, SiOC, SiON, SiOCN, SiC, SiO, and/or SiN.

In an implementation, the method may further include forming a bottom antireflective coating (BARC) before forming the photoresist layer on the silicon-containing thin layer.

Exposure of the photoresist layer may be performed using, e.g., ArF, KrF, or EUV. After exposure, heat treatment may be performed at about 100° C. to about 500° C.

The etching process of the exposed part of the material layer may be performed through a dry etching process using an etching gas. In an implementation, the etching gas may include, e.g., $CHF_3$, $CF_4$, $Cl_2$, $BCl_3$, or a mixed gas thereof.

The etched material layer may be formed in a plurality of patterns, and the plurality of patterns may include, e.g., a metal pattern, a semiconductor pattern, an insulation pattern, or the like. For example, the plurality of patterns may include diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE

Synthesis Example 1

Indole (3.5 g, 30 mol), pyrene (6 g, 30 mol), and para-formaldehyde (1.8 g, 20 mol) were put in a 250 ml flask. Subsequently, a solution obtained by dissolving p-toluene sulfonic acid monohydrate (0.57 g, 3 mmol) in 100 g of propylene glycol monomethyl ether acetate (PGMEA) was put in the flask, and the mixture was stirred at 90° C. Then, a sample was taken from the polymerization reactant every hour, and when the sample has a weight average molecular weight of 3,000 to 3,500, a reaction was completed.

When the reaction was complete, the reactant was cooled down to ambient temperature and added to 300 g of distilled water and 300 g of methanol, and the mixture was fervently stirred and allowed to stand. After removing a supernatant therefrom, a precipitate therein was dissolved in 100 g of propyleneglycol monomethyl ether acetate (PGMEA), and the solution was strongly stirred with 300 g of methanol and 300 g of distilled water and allowed to stand (a first process). After removing the obtained supernatant again therefrom, a precipitate therein was dissolved in 80 g of propylene glycol monomethyl ether acetate (PGMEA) (a second process). The first and second processes were regarded as one purification process, and this purification process was totally performed three times The purified polymer was dissolved in 80 g of propylene glycol monomethyl ether acetate (PGMEA), and the methanol and the distilled water remaining in the solution were removed under a reduced pressure, obtaining a polymer including a structural unit represented by Chemical Formula 1a.

[Chemical Formula 1a]

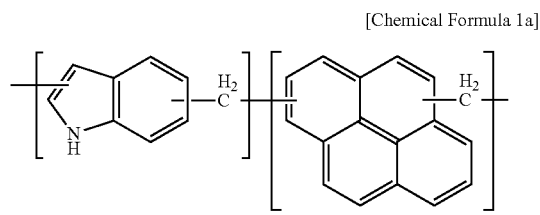

(weight average molecular weight: 2,800 and polydispersity: 1.51)

Synthesis Example 2

A polymer including a structural unit represented by Chemical Formula 1b was prepared according to the same method as Synthesis Example 1 except for using hydroxypyrene instead of the pyrene.

[Chemical Formula 1b]

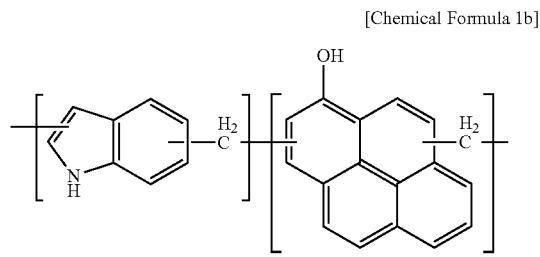

(weight average molecular weight: 3,150 and polydispersity: 1.59)

Synthesis Example 3

A polymer including a structural unit represented by Chemical Formula 1c was prepared according to the same method as Synthesis Example 1 except for using 1-naphthol instead of the pyrene.

[Chemical Formula 1c]

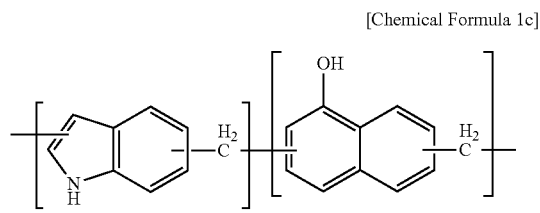

(weight average molecular weight: 1,890 and polydispersity: 1.45)

Synthesis Example 4

A polymer including a structural unit represented by Chemical Formula 1d was prepared according to the same method as Synthesis Example 1 except for using 2-phenylbenzoxazole instead of the indole and 1-naphthol instead of the pyrene.

[Chemical Formula 1d]

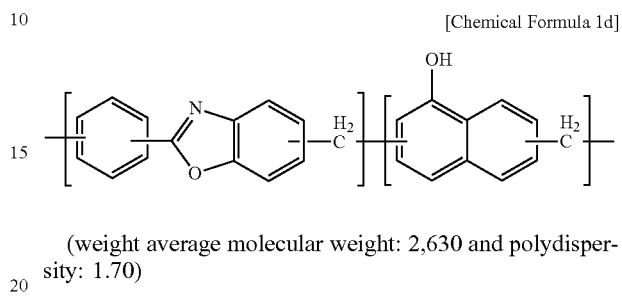

(weight average molecular weight: 2,630 and polydispersity: 1.70)

Synthesis Example 5

A polymer including a structural unit represented by Chemical Formula 1e was prepared according to the same method as Synthesis Example 1 except for using 2-phenylbenzoxazole instead of the indole and hydroxypyrene instead of the pyrene.

[Chemical Formula 1e]

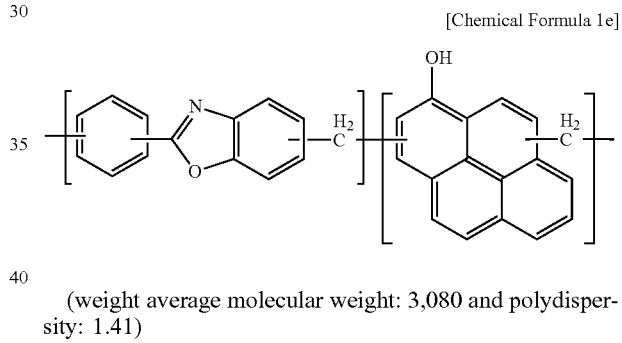

(weight average molecular weight: 3,080 and polydispersity: 1.41)

Synthesis Example 6

A polymer including a structural unit represented by Chemical Formula 1f was prepared according to the same method as Synthesis Example 1 except for using 2-phenylbenzothiazole instead of the indole and 1-naphthol instead of the pyrene.

[Chemical Formula 1f]

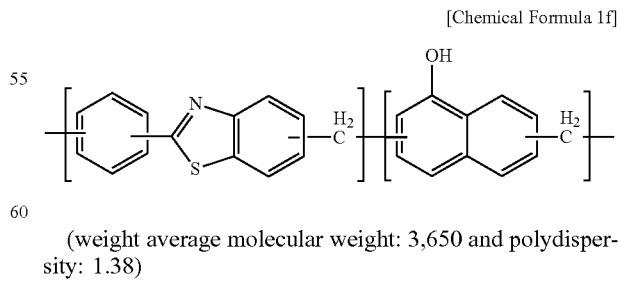

(weight average molecular weight: 3,650 and polydispersity: 1.38)

Synthesis Example 7

A polymer including a structural unit represented by Chemical Formula 1g was prepared according to the same method as Synthesis Example 1 except for using 2-phenyl-benzothiazole instead of the indole and hydroxypyrene instead of the pyrene.

[Chemical Formula 1g]

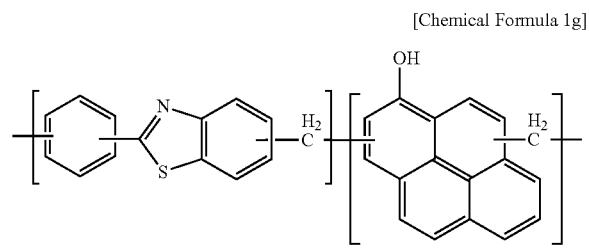

(weight average molecular weight: 3,810 and polydispersity: 1.72)

Synthesis Example 8

A polymer including a structural unit represented by Chemical Formula 1h was prepared according to the same method as Synthesis Example 1 except for using 4,4'-(9H-fluorene-9,9-diyl)diphenol instead of the pyrene.

[Chemical Formula 1h]

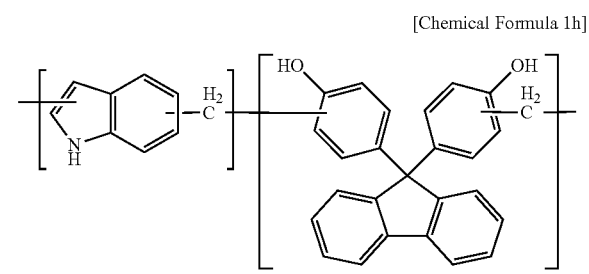

(weight average molecular weight: 3,900 and polydispersity: 1.69)

Comparative Synthesis Example 1

9,9-bis(4-hydroxyphenyl)-9H-fluorene (21 g, 0.057 mol) and 4,4-methoxymethylbenzene (9.6 g, 0.057 mol) were sequentially put in a 500 ml flask and dissolved in 51 g of propylene glycol monomethylether acetate (PGMEA), p-toluenesulfonic acid monohydrate (0.001 mol) was added thereto, and the mixture was stirred at 100° C. for 5 hours. Subsequently, a sample was taken from the polymerization reactant every hour, and when the sample had a weight average molecular weight of 3,500 to 4,000, the reaction was completed. Then, a polymer including a structural unit represented by Chemical Formula A was obtained through the same purification process as Synthesis Example 1.

[Chemical Formula A]

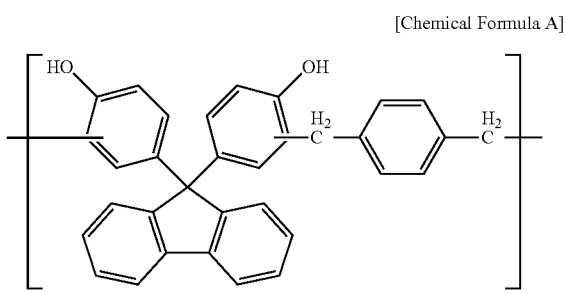

Comparative Synthesis Example 2

9,9-bis(4-hydroxyphenyl)-9H-fluorene (35 g, 0.1 mol), 1-naphthol (14.4 g, 0.1 mol), and paraformaldehyde (1.2 g, 0.034 mol) were put in a 500 ml flask. Subsequently, a solution obtained by dissolving p-toluenesulfonic acid monohydrate (0.19 g, 0.34 mol) in 162 g of propylene glycol monomethyl ether acetate (PGMEA) was added to the flask. The mixture was stirred at 100° C. for 5 hours. Subsequently, a sample was taken from the polymerization reactant every hour, and when the sample had a weight average molecular weight of 3,500 to 4,000, a reaction was completed. Then, a polymer including a structural unit represented by Chemical Formula B was obtained through the same purification process as Synthesis Example 1.

[Chemical Formula B]

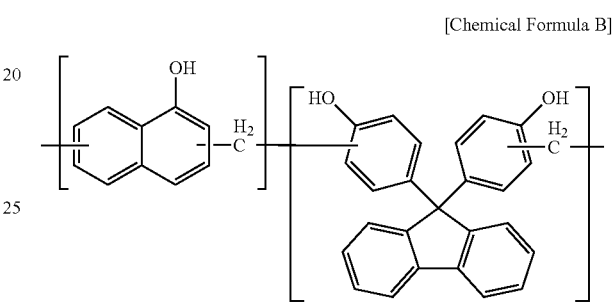

Preparation of Hardmask Composition

Example 1

The polymer according to Synthesis Example 1 was dissolved in a mixed solvent of propylene glycolmonomethyl ether acetate (PGMEA) and ethyl lactate (EL) (7:3 (v/v)), and the solution was filtered with a 0.1 μm TEFLON (tetrafluoroethylene) filter, preparing a hardmask composition. The polymer was adjusted regarding a weight in a range of 3.0 wt % to 15.0 wt %, based on the total weight of the hardmask composition depending on a desired thickness.

Examples 2 to 8

Each hardmask composition according to Examples 2 to 8 was prepared according to the same method as Example 1 except for respectively using the polymers according to Synthesis Examples 2 to 8 instead of the polymer according to Synthesis Example 1.

Comparative Examples 1 and 2

Each hardmask composition was prepared according to the same method as Example 1 except for respectively using the polymers according to Comparative Synthesis Examples 1 and 2 instead of the polymer according to Synthesis Example 1.

Evaluation 1: Film Density

Each hardmask composition according to Examples 1 to 8 and Comparative Examples 1 and 2 was spin-on coated on a silicon wafer, heat-treated at 400° C. for 2 minutes, forming about 1,000 Å-thick thin films. The thin film was measured regarding film density by using X-ray diffraction equipment made by PANalytical.

The results are shown in Table 1.

TABLE 1

|  | Film density (g/cm³) |
|---|---|
| Example 1 | 1.35 |
| Example 2 | 1.36 |
| Example 3 | 1.31 |
| Example 4 | 1.30 |
| Example 5 | 1.31 |
| Example 6 | 1.29 |
| Example 7 | 1.29 |
| Example 8 | 1.29 |
| Comparative Example 1 | 1.21 |
| Comparative Example 2 | 1.23 |

Referring to Table 1, each thin film respectively formed of the hardmask compositions according to Examples 1 to 8 showed higher film density than each thin film respectively formed of the hardmask compositions according to Comparative Examples 1 and 2.

For example, the hardmask compositions according to Examples 1 to 8 all formed dense and firm thin films, compared with the hardmask compositions according to Comparative Examples 1 and 2.

Evaluation 2: Out-Gas

The hardmask compositions according to Examples 1 to 8 and Comparative Examples 1 and 2 were respectively coated to be about 2,000 Å thick on a silicon wafer and baked at 400° C. for 5 minutes, and out-gas generated during the baking was measured by using QCM (Quartz Crystal Microbalance), and the amount (ng) of the out-gas was calculated according to Calculation Equation 1 in FIG. 1.

The results are shown in Table 2.

TABLE 2

|  | Out-gas amount (ng) |
|---|---|
| Example 1 | 76 |
| Example 2 | 67 |
| Example 3 | 92 |
| Example 4 | 76 |
| Example 5 | 72 |
| Example 6 | 69 |
| Example 7 | 68 |
| Example 8 | 65 |
| Comparative Example 1 | 101 |
| Comparative Example 2 | 98 |

Referring to Table 2, each thin film respectively formed of the hardmask compositions according to Examples 1 to 8 generated a relatively small amount of out-gas during the baking at a high temperature of 400° C., compared with each thin film respectively formed of the hardmask compositions according to Comparative Examples 1 and 2. Accordingly, it may be seen that the hardmask compositions according to Examples 1 to 8 may be advantageously applied to a high temperature process.

Evaluation 3: Etch Resistance

The hardmask compositions according to Examples 1 to 8 and Comparative Examples 1 and 2 were respectively spin-on coated on a silicon wafer and baked on a hot plate at 400° C. for 2 minutes, forming an about 4,000 Å-thick thin film. The thickness of the thin film was measured by using thin film thickness-measuring equipment made by K-MAC.

Subsequently, the thin film was dry-etched respectively with $CF_4$ gas and $N_2/O_2$ mixed gas for 60 seconds and for 100 seconds, and then, the thickness of the thin film was measured.

The etch resistance of the thin film was evaluated from a bulk etch rate (BER) as shown in Calculation Equation 2.

Bulk etch rate (BER)=(Initial thickness of thin film−Thickness of thin film after etching)/Etching time (Å/s)   [Calculation Equation 2]

The results are shown in Table 3.

TABLE 3

|  | Bulk etch rate (Å/sec) | |
|---|---|---|
|  | $CF_4$ etching | $N_2O_2$ etching |
| Example 1 | 24.9 | 24.0 |
| Example 2 | 25.6 | 24.6 |
| Example 3 | 27.0 | 25.6 |
| Example 4 | 27.5 | 26.2 |
| Example 5 | 27.1 | 26.3 |
| Example 6 | 26.9 | 27.2 |
| Example 7 | 26.8 | 25.1 |
| Example 8 | 30.5 | 25.1 |
| Comparative Example 1 | 33.4 | 28.5 |
| Comparative Example 2 | 32.1 | 27.0 |

Referring to Table 3, each thin film respectively formed of the hardmask compositions according to Examples 1 to 8 had a lower bulk etch rate than each thin film respectively formed of the hardmask compositions according to Comparative Examples 1 and 2.

Accordingly, the hardmask compositions according to Examples 1 to 8 exhibited high etch resistance, compared with the hardmask compositions according to Comparative Examples 1 and 2.

Evaluation 4: Gap-Fill and Planarization Characteristics

The hardmask compositions according to Examples 1 to 8 and Comparative Examples 1 and 2 were respectively spin-on coated on a patterned silicon wafer and baked at 400° C. for 2 minutes, and then, gap-fill characteristics and planarization characteristics were examined by using a FE-SEM equipment.

The gap-fill characteristics were evaluated by examining the cross-section of the pattern with an electron scanning microscope (SEM) to see whether there was a void, and the planarization characteristics were evaluated by measuring the thickness of the hardmask layer from the SEM image of the pattern cross-section and putting it in Calculation Equation 3 in FIG. 2. Herein, the planarization characteristics are excellent as a difference between h1 and h2 is small.

For example, the h1 was 2,000 Å after the baking by adjusting the amount of a polymer included in the hardmask compositions according to Examples 1 to 8 and Comparative Examples 1 and 2.

The results are shown in Table 4.

TABLE 4

|  | Planarization characteristics (h1-h2, Å) | | Gap-fill |
|---|---|---|---|
|  | aspect ratio (1:2) | aspect ratio (1:10) | characteristics (void: yes/no) |
| Example 1 | 80 | 178 | No void |
| Example 2 | 90 | 169 | No void |
| Example 3 | 78 | 180 | No void |
| Example 4 | 86 | 189 | No void |
| Example 5 | 79 | 174 | No void |
| Example 6 | 90 | 175 | No void |
| Example 7 | 78 | 198 | No void |
| Example 8 | 97 | 180 | No void |

TABLE 4-continued

| | Planarization characteristics (h1-h2, Å) | | Gap-fill |
|---|---|---|---|
| | aspect ratio (1:2) | aspect ratio (1:10) | characteristics (void: yes/no) |
| Comparative Example 1 | 150 | 253 | Void |
| Comparative Example 2 | 139 | 280 | Void |

Referring to Table 4, the hardmask compositions according to Examples 1 to 8 showed excellent planarization, compared with the hardmask compositions according to Comparative Examples 1 and 2 and also, no void under a condition of a deep pattern depth (an aspect ratio=1:15) and thus excellent gap-fill characteristics.

By way of summation and review, the hardmask layer plays a role of an interlayer transferring the fine pattern of the photoresist to a material layer through a selective etching process. Accordingly, the hardmask layer may exhibit characteristics such as etch resistance and the like to endure multi-etching processes.

A spin-on coating method, instead of a chemical vapor deposition (CVD) method, has been considered to form the hardmask layer. Heat resistance and etch resistance may have a trade-off relationship with spin-on characteristics, and an organic layer material satisfying all the characteristics may be desirable.

The embodiments may provide a polymer having excellent etch resistance and simultaneously good solubility characteristics.

The polymer according to an embodiment may have satisfactory solubility characteristics as well as excellent mechanical characteristics, etch resistance, and heat resistance and thus may be applicable in a spin-on coating method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polymer comprising a structural unit represented by Chemical Formula 1 and a structural unit represented by Chemical Formula 2:

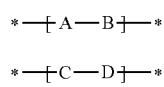

[Chemical Formula 1]

[Chemical Formula 2]

wherein, in Chemical Formula 1,
B is a divalent organic group,
* is a linking point, and
A is a substituted or unsubstituted divalent group from one of the following compounds,

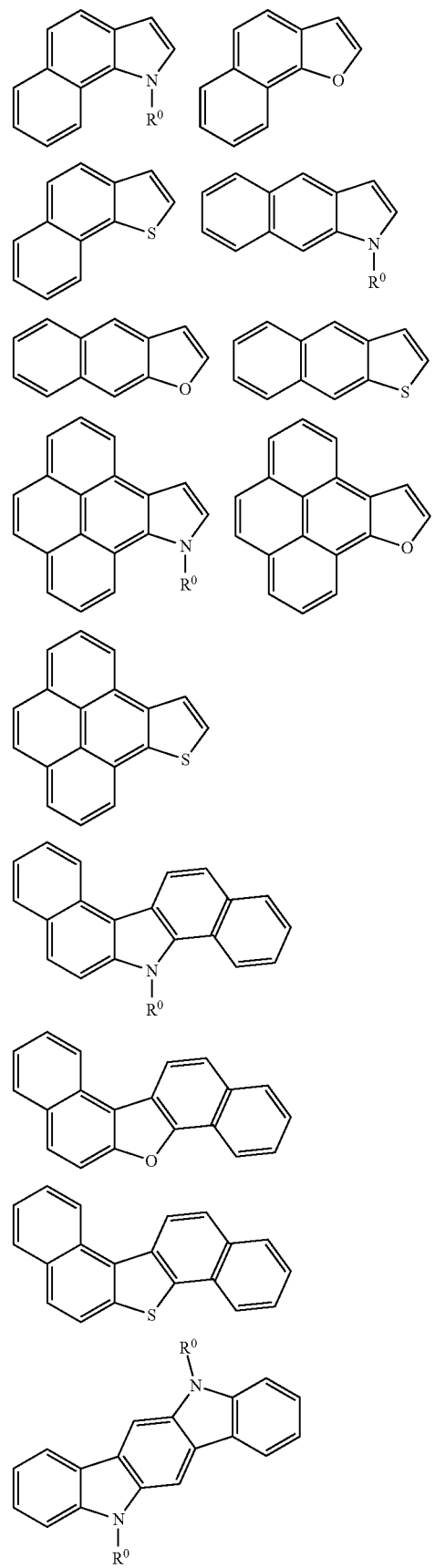

-continued
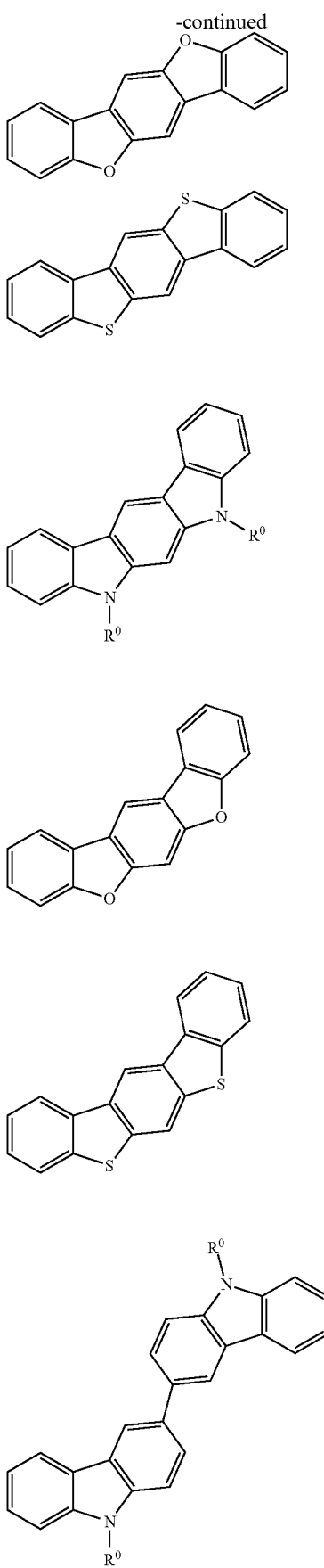
-continued
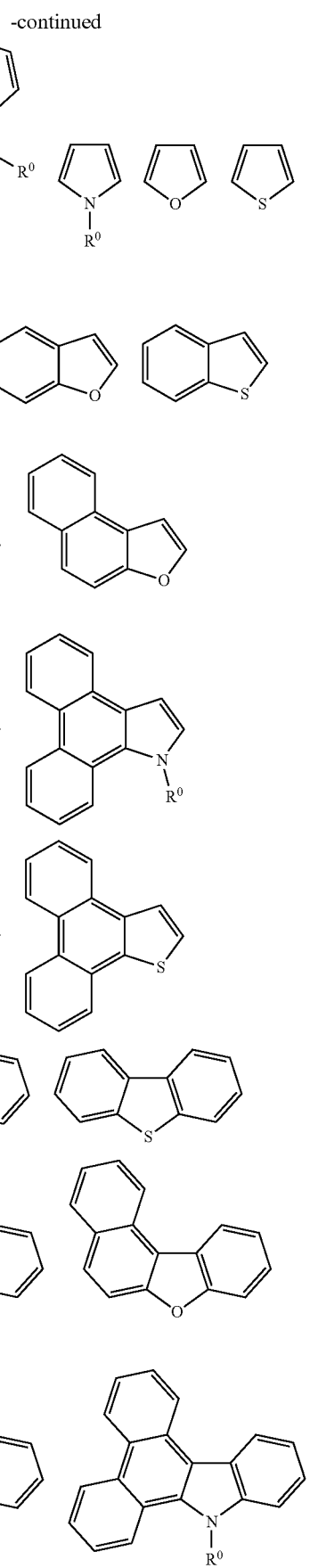

-continued

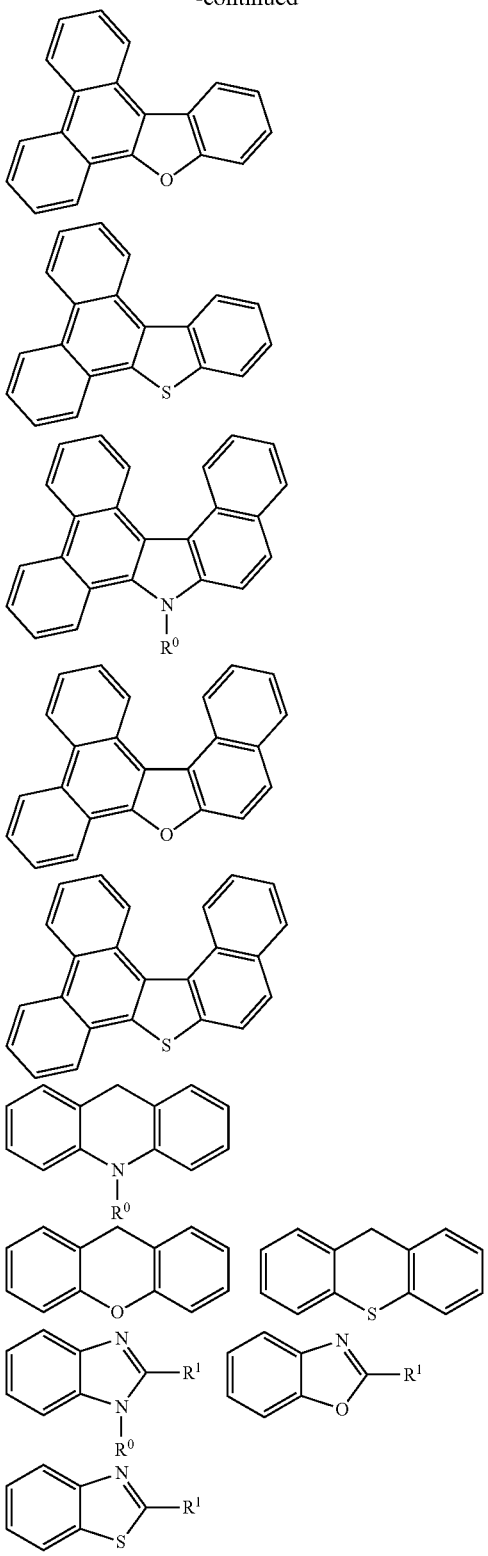

wherein, in the above compounds, R⁰ and R¹ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, and wherein, in Chemical Formula 2,
C is a group including a substituted or unsubstituted aromatic ring,
D is a divalent organic group, and
* is a linking point.

2. The polymer as claimed in claim 1, wherein R¹ is a substituted or unsubstituted phenyl group.

3. The polymer as claimed in claim 1, wherein, in Chemical Formula 1, B is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

4. The polymer as claimed in claim 1, wherein the structural unit represented by Chemical Formula 1 is represented by one of Chemical Formula 1-1 or Chemical Formula 1-2:

[Chemical Formula 1-1]

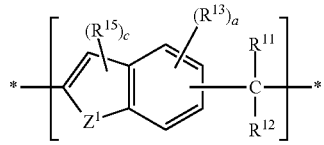

[Chemical Formula 1-2]

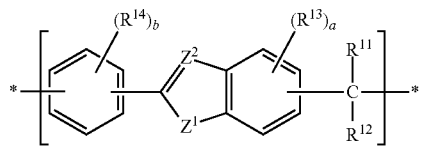

wherein, in Chemical Formulae 1-1 and 1-2,
Z¹ is NR¹⁰, oxygen (O), or sulfur (S),
Z² is nitrogen (N),
R¹⁰, R¹¹, and R¹² are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof,
R¹³ to R¹⁵ are each independently a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof,
a and b are each independently an integer of 0 to 3,
c is 0 or 1, and
* is a linking point.

5. The polymer as claimed in claim 1, wherein, in Chemical Formula 2, C is a substituted or unsubstituted divalent group from one of the following compounds,

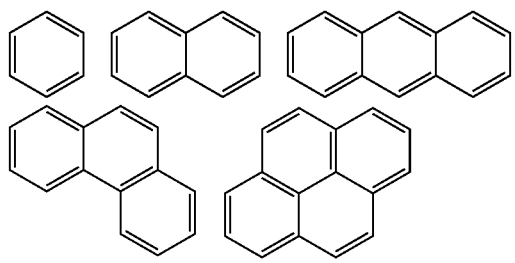

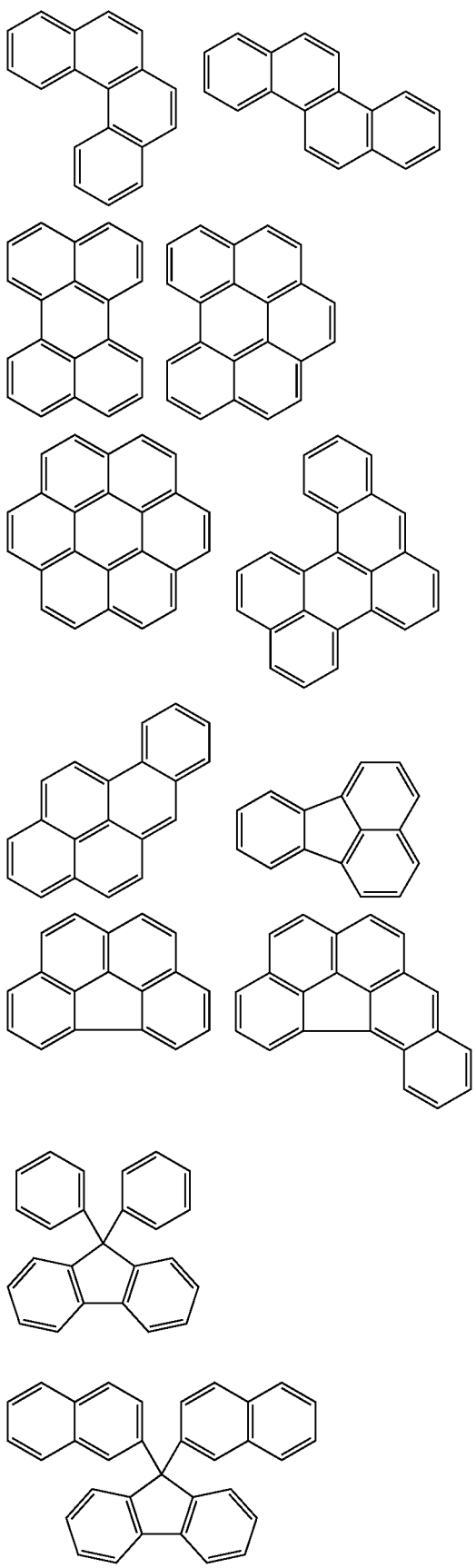
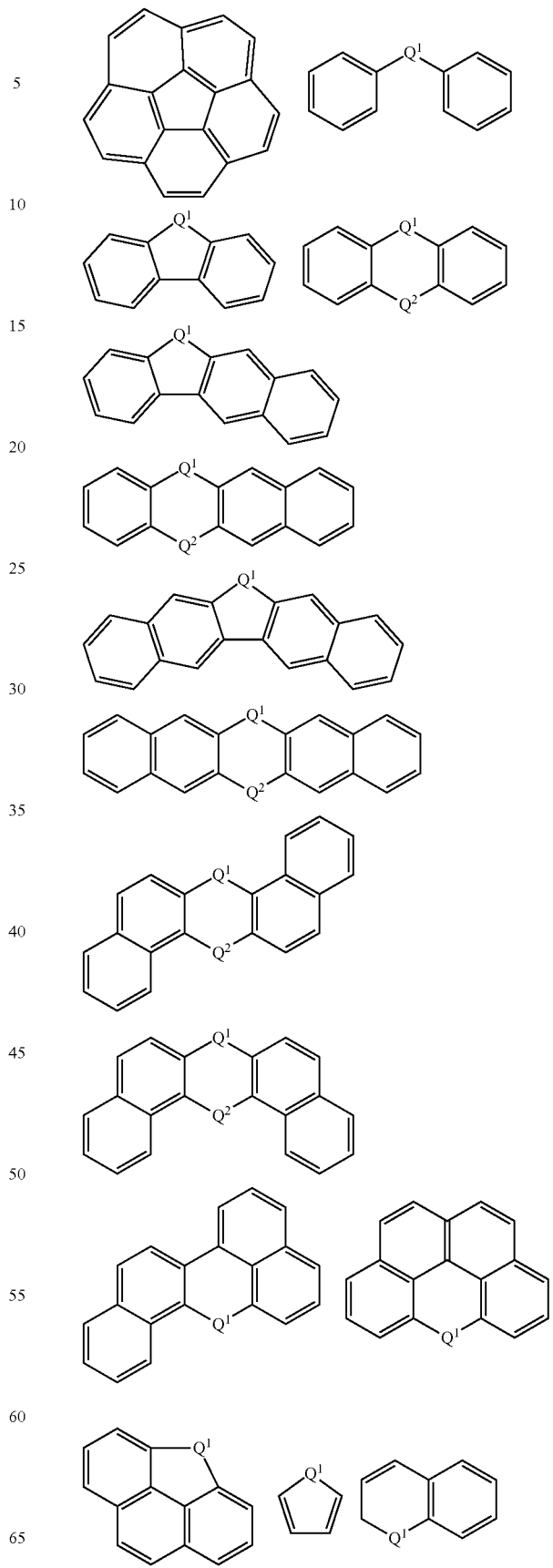

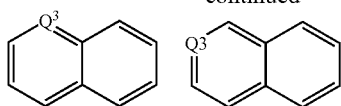

wherein, in the above compounds,
$Q^1$ and $Q^2$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof,
$Q^3$ is nitrogen (N), $CR^b$, or a combination thereof, and
$R^a$ and $R^b$ are each independently hydrogen, a substituted or unsubstituted C1 to C10 alkyl group, a halogen atom, a halogen-containing group, or a combination thereof.

6. The polymer as claimed in claim 1, wherein, in Chemical Formula 2, D is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

7. The polymer as claimed in claim 1, wherein the structural unit represented by Chemical Formula 2 is represented by one of Chemical Formulae 2-1 to 2-3:

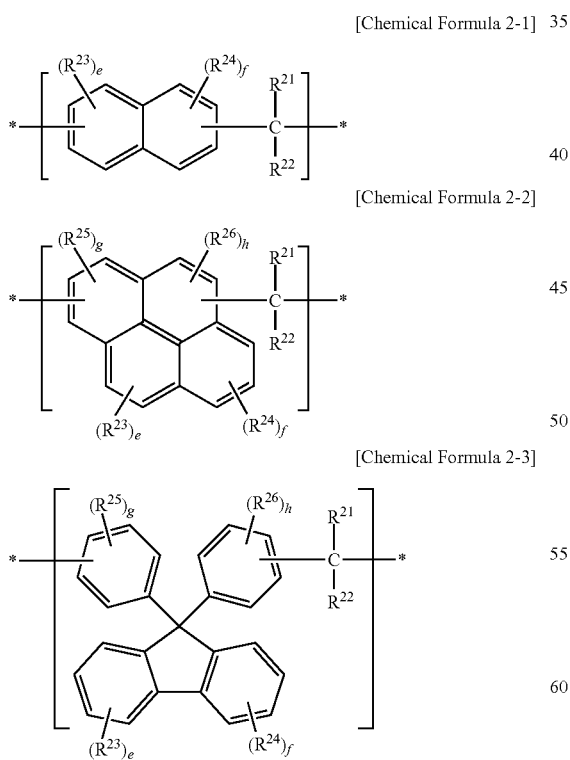

wherein, in Chemical Formulae 2-1 to 2-3,
$R^{21}$ and $R^{22}$ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof,
$R^{23}$ to $R^{26}$ are independently a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof,
e to h are independently an integer ranging from 0 to 2, and
* is a linking point.

8. The polymer as claimed in claim 1, wherein the polymer has a weight average molecular weight of about 500 to about 200,000.

9. An organic layer composition, comprising:
a polymer including a structural unit represented by Chemical Formula 1 and a structural unit represented by Chemical Formula 2, and
a solvent:

 [Chemical Formula 1]

 [Chemical Formula 2]

wherein, in Chemical Formula 1,
B is a divalent organic group,
* is a linking point, and
A is a substituted or unsubstituted divalent group from one of the following compounds,

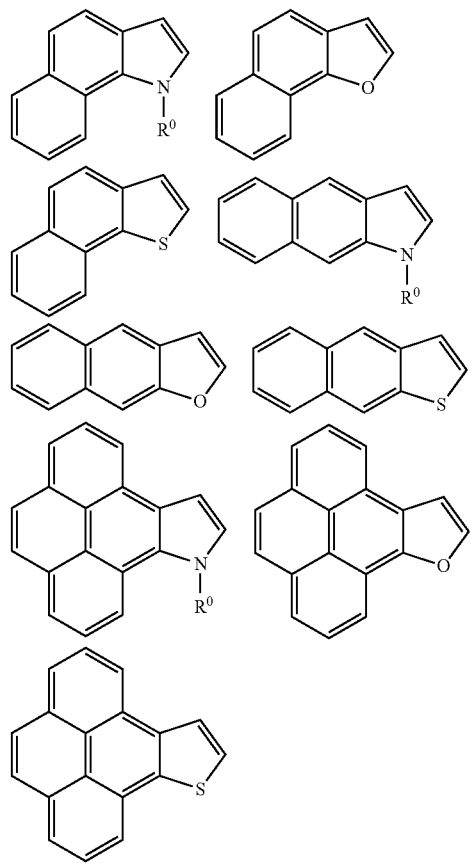

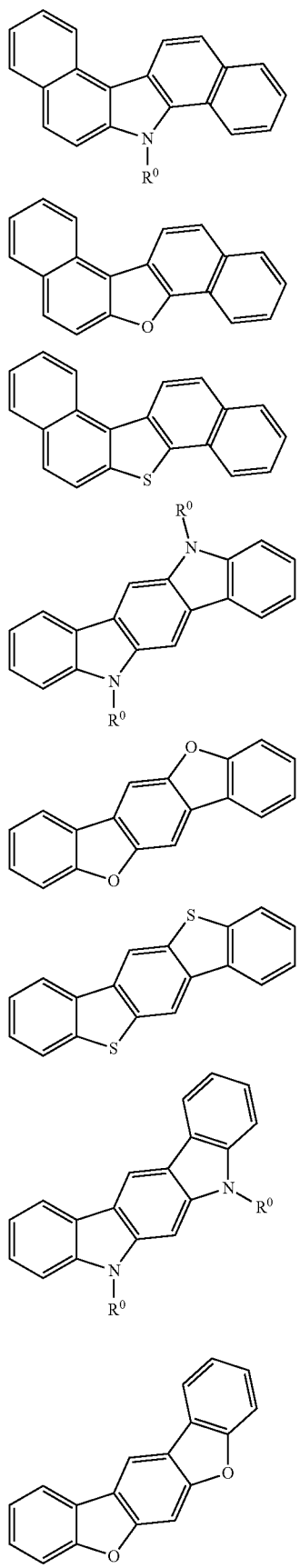
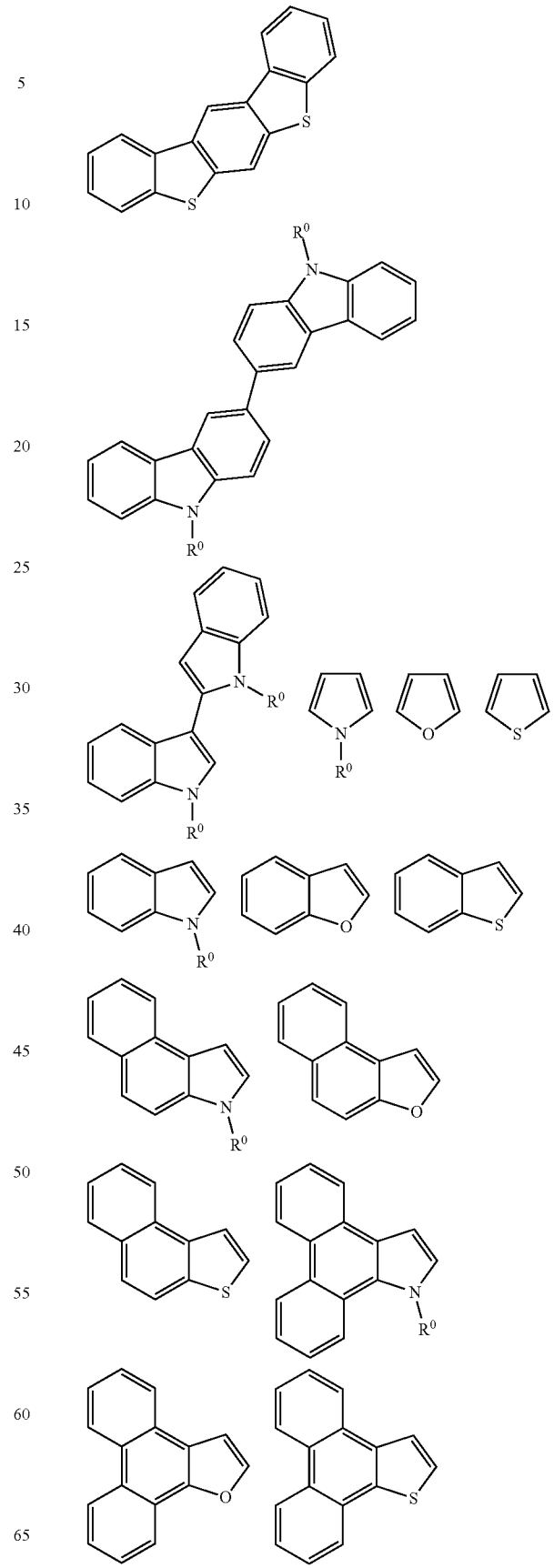

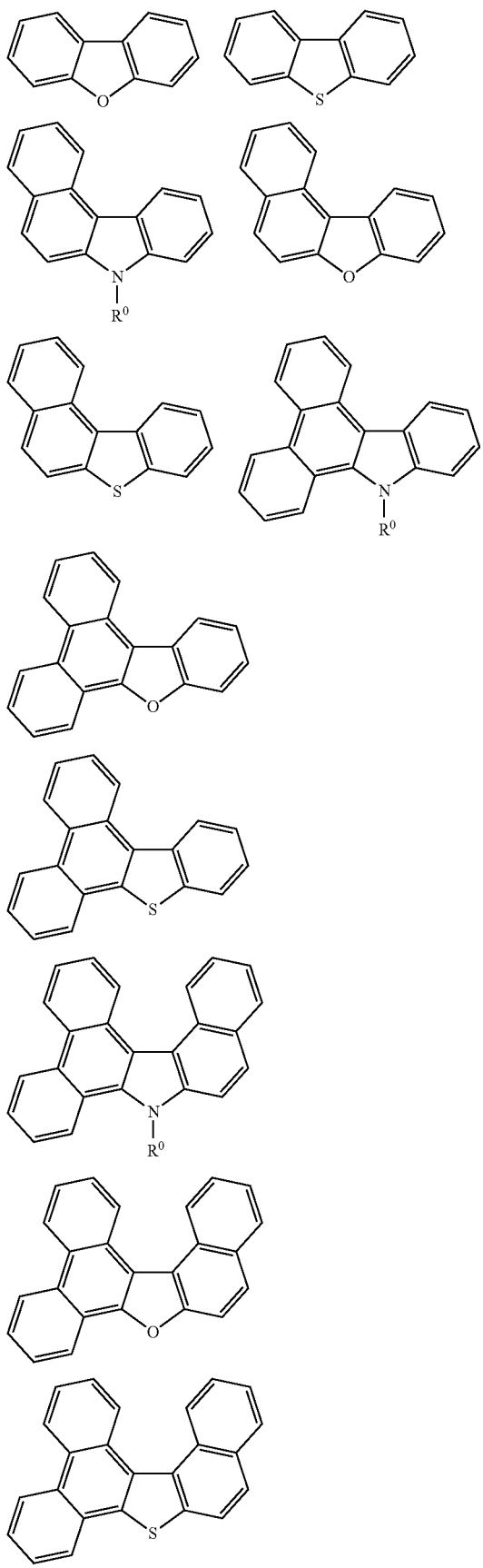

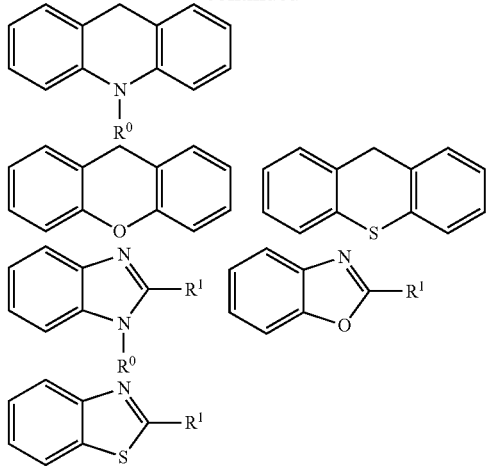

wherein, in the above compounds, $R^0$ and $R^1$ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, and wherein, in Chemical Formula 2, C is a group including a substituted or unsubstituted aromatic ring, D is a divalent organic group, and

* is a linking point.

10. The organic layer composition as claimed in claim 9, wherein $R^1$ is a substituted or unsubstituted phenyl group.

11. The organic layer composition as claimed in claim 9, wherein, in Chemical Formula 1, B is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

12. The organic layer composition as claimed in claim 9, wherein the structural unit represented by Chemical Formula 1 is represented by one of Chemical Formula 1-1 or Chemical Formula 1-2:

wherein, in Chemical Formulae 1-1 and 1-2, $Z^1$ is $NR^{10}$, oxygen (O), or sulfur (S), $Z^2$ is nitrogen (N), $R^{10}$, $R^{11}$, and $R^{12}$ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, $R^{13}$ to $R^{15}$ are each independently a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof, a and b are each independently an integer of 0 to 3, c is 0 or 1, and

* is a linking point.

13. The organic layer composition as claimed in claim 9, wherein, in Chemical Formula 2, C is a substituted or unsubstituted divalent group from one of the following compounds,

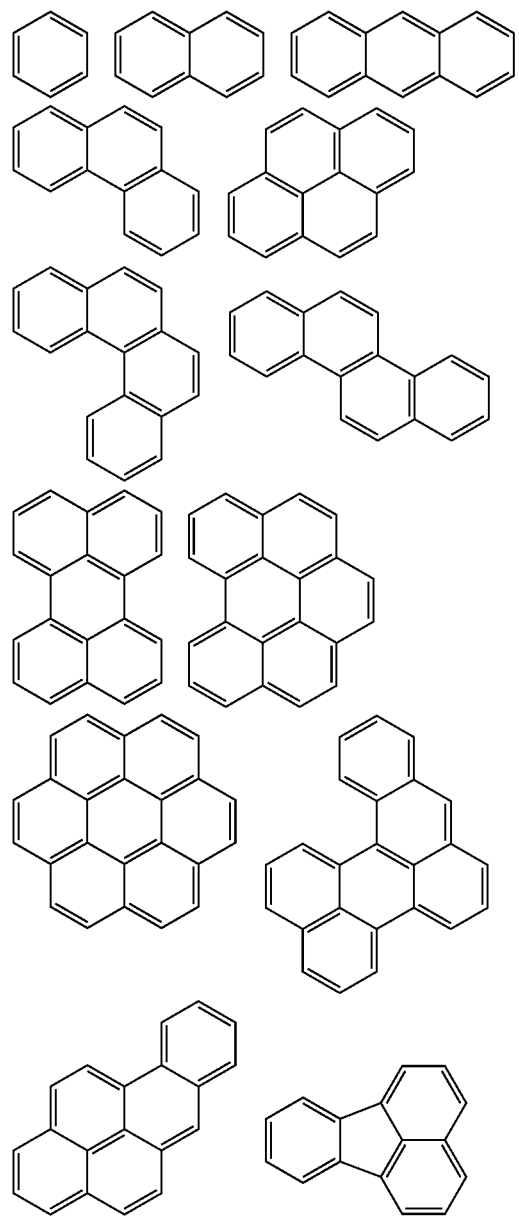

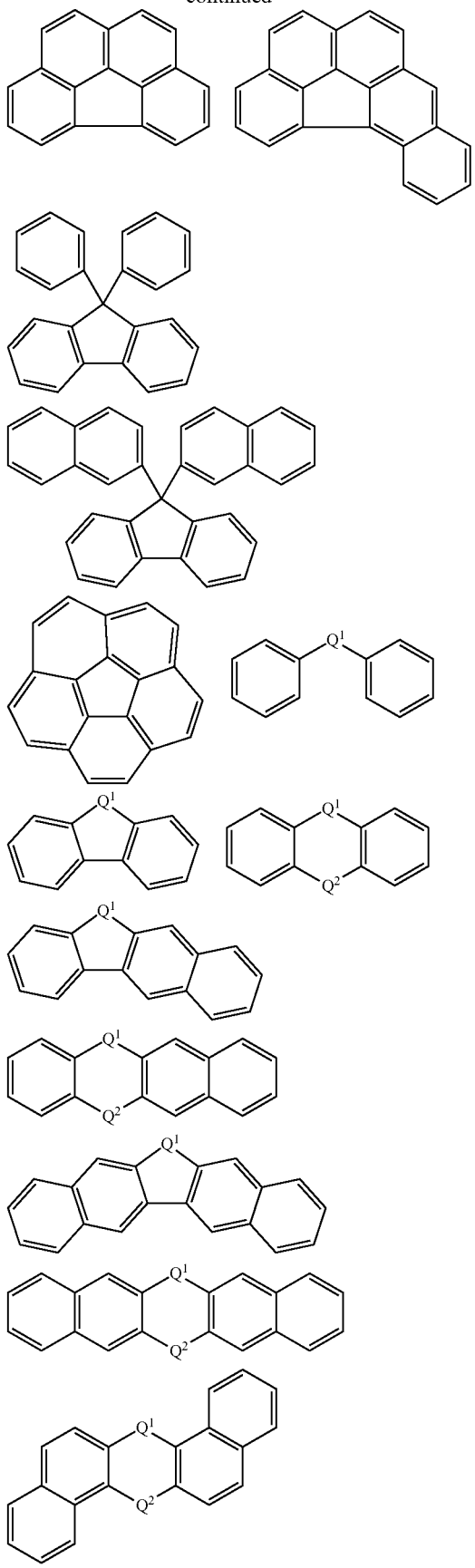

-continued

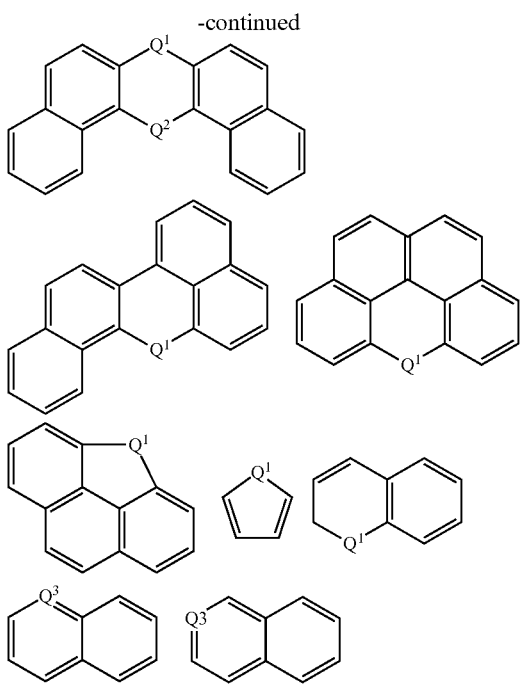

wherein, in the above compounds,
$Q^1$ and $Q^2$ are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkynylene group, a substituted or unsubstituted C2 to C20 alkynylene group, C=O, $NR^a$, oxygen (O), sulfur (S), or a combination thereof,
$Q^3$ is nitrogen (N), $CR^h$, or a combination thereof, and
$R^a$ and $R^h$ are each independently hydrogen, a substituted or unsubstituted C1 to C10 alkyl group, a halogen atom, a halogen-containing group, or a combination thereof.

14. The organic layer composition as claimed in claim 9, wherein, in Chemical Formula 2, D is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof.

15. The organic layer composition as claimed in claim 9, wherein the structural unit represented by Chemical Formula 2 is represented by one of Chemical Formulae 2-1 to 2-3:

[Chemical Formula 2-1]

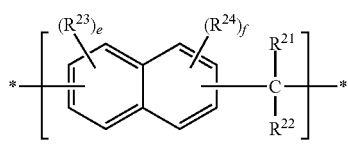

[Chemical Formula 2-2]

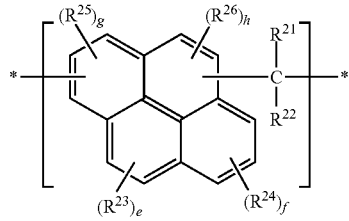

[Chemical Formula 2-3]

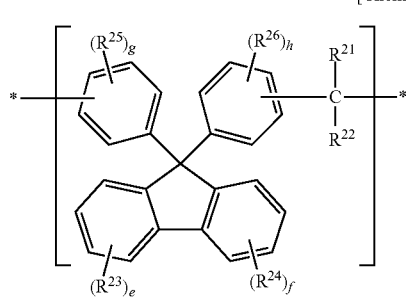

wherein, in Chemical Formulae 2-1 to 2-3,
$R^{21}$ and $R^{22}$ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof,
$R^{23}$ to $R^{26}$ are independently a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof,
e to h are independently an integer ranging from 0 to 2, and
* is a linking point.

16. The organic layer composition as claimed in claim 9, wherein the polymer has a weight average molecular weight of about 500 to about 200,000.

17. A method of forming patterns, the method comprising:
providing a material layer on a substrate,
applying the organic layer composition as claimed in claim 9 on the material layer,
heat-treating the organic layer composition to provide a hardmask layer,
providing a silicon-containing thin layer on the hardmask layer,
providing a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

18. The method as claimed in claim 17, wherein applying the organic layer composition includes performing a spin-on coating method.

* * * * *